US009902814B2

(12) United States Patent
Jeon et al.

(10) Patent No.: US 9,902,814 B2
(45) Date of Patent: Feb. 27, 2018

(54) TRANSPARENT POLYMER FILM AND ELECTRONIC DEVICE INCLUDING THE SAME

(71) Applicants: SAMSUNG ELECTRONICS CO., LTD., Suwon-si, Gyeonggi-do (KR); Samsung SDI Co., Ltd., Yongin-si, Gyeonggi-do (KR)

(72) Inventors: Hyunjeong Jeon, Seoul (KR); Sang Soo Jee, Hwaseong-si (KR); Hongkyoon Choi, Seoul (KR); Byunghee Sohn, Yongin-si (KR); Kyeong-Sik Ju, Suwon-si (KR)

(73) Assignees: SAMSUNG ELECTRONICS CO., LTD., Gyeonggi-Do (KR); SAMSUNG SDI CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/356,952

(22) Filed: Nov. 21, 2016

(65) Prior Publication Data
US 2017/0145166 A1    May 25, 2017

(30) Foreign Application Priority Data
Nov. 23, 2015   (KR) .................. 10-2015-0163917

(51) Int. Cl.
*C08G 83/00*    (2006.01)
(52) U.S. Cl.
CPC .................. *C08G 83/001* (2013.01)
(58) Field of Classification Search
None
See application file for complete search history.

(56) References Cited

U.S. PATENT DOCUMENTS

| | | | |
|---|---|---|---|
| 7,619,042 B2 | 11/2009 | Poe et al. | |
| 7,993,735 B1* | 8/2011 | Pietrantoni | ........ C08G 73/1039 264/104 |
| 8,283,398 B2 | 10/2012 | Wu et al. | |
| 2005/0154150 A1 | 7/2005 | Wei et al. | |
| 2007/0026225 A1* | 2/2007 | Chen | .................. B32B 27/38 428/336 |
| 2011/0027589 A1* | 2/2011 | Wu | .................. G03G 15/162 428/407 |
| 2011/0027598 A1 | 2/2011 | Wu et al. | |
| 2011/0223436 A1* | 9/2011 | Wu | .................. G03G 15/162 428/474.4 |
| 2011/0232761 A1 | 9/2011 | Lomasney | |
| 2012/0184688 A1 | 7/2012 | Jung et al. | |
| 2015/0225607 A1 | 8/2015 | Cho et al. | |

FOREIGN PATENT DOCUMENTS

KR       1138798 B1    4/2012

OTHER PUBLICATIONS

Son et al. "Microstructure and properties of polyamideimide/silica hybrids compatibilized with 3-aminopropyltriethoxysilane" European Polymer Journal 44, 2008, 2236-2243.*
Yen et al. "Synthesis and properties of new polyimide-silica hybrid films through both intrachain and interchain bonding" Polymer 44, 2003, 7079-7087.*
Extended European Search Report dated May 11, 2017, issued for the corresponding European Patent Application No. 16199789.5-1302.
"Silsesquioxanes: Bridging the Gap Between Polymers & Ceramics", ChemFiles, vol. 1, No. 6, 2001, 14 pp.
Keun-byoung Yoon, et al. "Synthesis and Characteristics of POSS Polymers", Polymer Science and Technology, vol. 16, No. 6, Dec. 2005, pp. 833-842.
Seung Sang Hwang, et al. "Polysilsesquioxane", Polymer Science and Technology, vol. 20, No. 2, Apr. 2009, pp. 135-140.

* cited by examiner

*Primary Examiner* — Robert S Loewe
(74) *Attorney, Agent, or Firm* — Cantor Colburn LLP

(57) ABSTRACT

A composition for preparing an organic/inorganic hybrid poly(amide-imide) copolymer including a poly(amide-imide) copolymer, a poly(amide-amic acid) copolymer, or a poly(amide-imide/amic acid) copolymer including a structural unit represented by Chemical Formula 1; and a structural unit represented by Chemical Formula 2, a structural unit represented by Chemical Formula 3, or a combination thereof, and a polyhedral oligomeric silsesquioxane including a functional group capable of forming a hydrogen bond:

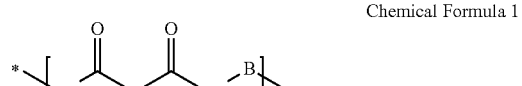

Chemical Formula 1

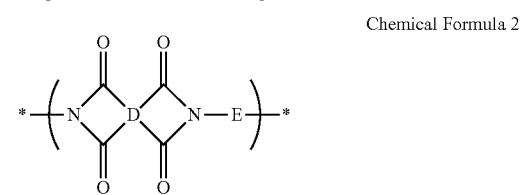

Chemical Formula 2

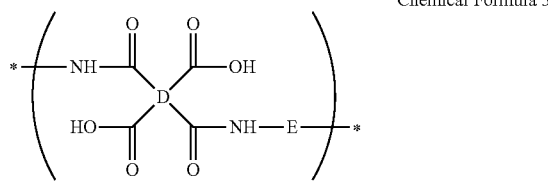

Chemical Formula 3 wherein in Chemical Formulae 1 to 3, A, B, D, and E are the same as defined in the detailed description.

22 Claims, 7 Drawing Sheets

TRANSPARENT POLYMER FILM AND ELECTRONIC DEVICE INCLUDING THE SAME

CROSS-REFERENCE TO RELATED APPLICATIONS

This application claims priority to and the benefit of Korean Patent Application No. 10-2015-0163917 filed in the Korean Intellectual Property Office on Nov. 23, 2015, the entire contents of which are incorporated herein by reference.

BACKGROUND

1. Field

A transparent polymer film and an electronic device including the same are disclosed.

2. Description of the Related Art

Recently, a thin, ultra-light and flexible display, which consumes a small amount of electricity, has been increasingly in demand as a display for visualizing various information and delivering it to users. The flexible display may be obtained by using a flexible substrate, organic and inorganic materials for a low temperature process, flexible electronics, encapsulation, packaging, and the like. Among these, the flexible substrate may have a substantial influence on the performance, reliability, and price of the flexible display. On the other hand, a flexible protective film having high transparency is required in an electronic device such as a light emitting diode or a complementary metal oxide film semiconductor sensor.

As for the flexible substrate or the flexible protective film, various polymer films have been suggested. In order to usefully apply the polymer films as the flexible substrate or the flexible protective film, their thermal properties as well as optical properties (e.g., high transparency and a low yellow index) need to be improved since a polymer is light and relatively easily formed into a film but originally has insufficient thermal stability (e.g., a high coefficient of thermal expansion). Thus, there remains a need in new films having excellent optical characteristics.

SUMMARY

An embodiment provides a composition for preparing an organic/inorganic hybrid poly(amide-imide) copolymer.

Another embodiment provides an article having improved mechanical characteristics and optical properties manufactured using the composition for preparing an organic/inorganic hybrid poly(amide-imide) copolymer.

Yet another embodiment provides a display device including the article.

An embodiment provides a composition for preparing an organic/inorganic hybrid poly(amide-imide) copolymer including:

a poly(amide-imide) copolymer, a poly(amide-amic acid) copolymer, or a poly(amide-imide/amic acid) copolymer including:

a structural unit represented by Chemical Formula 1; and a structural unit represented by Chemical Formula 2, a structural unit represented by Chemical Formula 3, or a combination thereof, and a polyhedral oligomeric silsesquioxane including a functional group capable of forming a hydrogen bond:

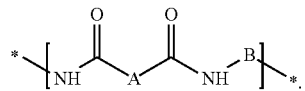

Chemical Formula 1

In Chemical Formula 1,

A and B are independently a substituted or unsubstituted divalent C6 to C24 aliphatic cyclic group, a substituted or unsubstituted C6 to C24 aromatic ring group or a substituted or unsubstituted divalent C4 to C24 hetero aromatic ring group, wherein the C6 to C24 aliphatic cyclic group, the C6 to C24 aromatic ring group, or the C4 to C24 hetero aromatic ring group is present as a single ring, two or more rings thereof are fused to each other to provide a condensed ring system, or two or more of the single ring or the condensed ring are linked through a single bond, a fluorenylene group, —O—, —S—, —C(=O)—, —CH(OH)—, —S(=O)$_2$—, —Si(CH$_3$)$_2$—, —(CH$_2$)$_p$— (wherein 1≤p≤10), —(CF$_2$)$_q$— (wherein 1≤q≤10), —CR"R"'— (wherein R" and R"' are independently hydrogen, a C1 to C10 aliphatic hydrocarbon group, a C6 to C20 aromatic hydrocarbon group, or a C6 to C20 alicyclic hydrocarbon group), —C(CF$_3$)$_2$—, —C(CF$_3$)(C$_6$H$_5$)—, or —C(=O)NH—,

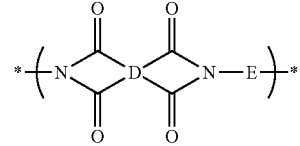

Chemical Formula 2

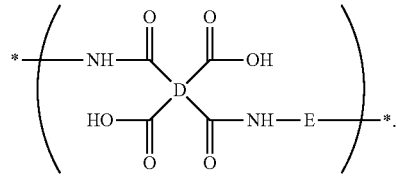

Chemical Formula 3

In Chemical Formulae 2 and 3,

D is a substituted or unsubstituted tetravalent C6 to C24 aliphatic cyclic group, a substituted or unsubstituted C6 to C24 aromatic ring group, or a substituted or unsubstituted tetravalent C4 to C24 hetero aromatic ring group, wherein the C6 to C24 aliphatic cyclic group, the C6 to C24 aromatic ring group, or the C4 to C24 hetero aromatic ring group is present as a single ring, two or more rings thereof are fused to each other to provide a condensed ring system, or two or more of the single ring or the condensed ring are linked through a single bond, —O—, —S—, —C(=O)—, —CH(OH)—, —S(=O)$_2$—, —Si(CH$_3$)$_2$—, —(CH$_2$)$_p$— (wherein 1≤p≤10), —(CF$_2$)$_q$— (wherein 1≤q≤10), —CR"R"'— (wherein R" and R"' are independently hydrogen, a C1 to C10 aliphatic hydrocarbon group, a C6 to C20 aromatic hydrocarbon group, or a C6 to C20 alicyclic hydrocarbon group), —C(CF$_3$)(C$_6$H$_5$)—, or —C(=O)NH—, and E is a substituted or unsubstituted divalent C6 to C24 aliphatic cyclic group, a substituted or unsubstituted C6 to C24 aromatic ring group or a substituted or unsubstituted divalent C4 to C24 hetero aromatic ring group, the C6 to C24 aliphatic cyclic group, the C6 to C24 aromatic ring group, or the C4 to C24 hetero aromatic ring group is present as a single ring, two or more rings thereof are fused to each other to provide a condensed ring system, or two or more of the single ring or the condensed ring are linked through a single bond, a fluorenylene group, —O—, —S—, —C(=O)—, —CH(OH)—, —S(=O)$_2$—, —Si(CH$_3$)$_2$—, —(CH$_2$)$_p$— (wherein 1≤p≤10), —(CF$_2$)$_q$— (wherein 1≤q≤10), —CR"R'"— (wherein R" and R'" are independently hydrogen, a C1 to C10 aliphatic hydrocarbon group, a C6 to C20 aromatic hydrocarbon group, or a C6 to C20 alicyclic hydrocarbon group), —C(CF$_3$)$_2$—, —C(CF$_3$) (C$_6$H$_5$)—, or —C(=O)NH—.

The functional group capable of forming a hydrogen bond of the polyhedral oligomeric silsesquioxane may be —OH, —SH, —NH$_2$, or a combination thereof.

The polyhedral oligomeric silsesquioxane including the functional group capable of forming a hydrogen bond may be represented by Chemical Formula 4 or Chemical Formula 5:

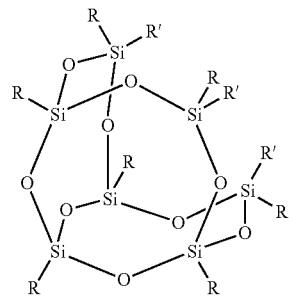

Chemical Formula 4

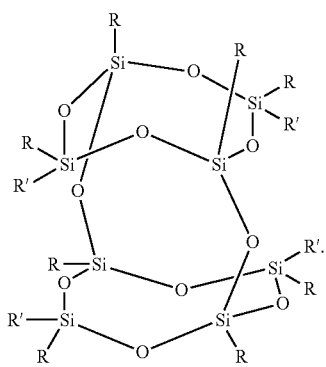

Chemical Formula 5

In Chemical Formulae 4 and 5,

R is independently a substituted or unsubstituted C1 to C30 alkyl group, a substituted or unsubstituted C3 to C30 cycloalkyl group, a substituted or unsubstituted C6 to C30 aryl group, or a combination thereof, and R' is independently —OH, —SH, or —NH$_2$.

In Chemical Formulae 4 and 5, R is independently a substituted or unsubstituted C1 to C12 alkyl group, a substituted or unsubstituted C3 to C10 cycloalkyl group, a substituted or unsubstituted C6 to C12 aryl group, or a combination thereof, and R' is independently, —OH, —SH, or —NH$_2$.

In Chemical Formulae 4 and 5, R is independently a cyclohexyl group or a phenyl group, and each R' is —OH.

Group A of Chemical Formula 1 may be selected from chemical formulae of Group 1:

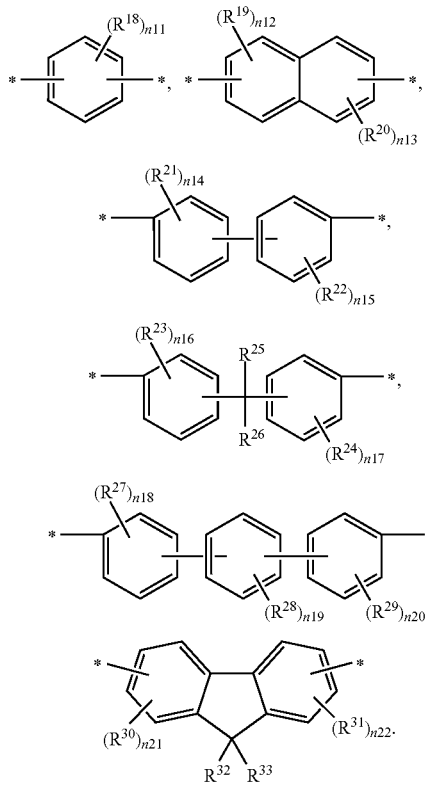

Group 1

In the above chemical formulae, $R^{18}$ to $R^{33}$ are the same or different and are independently deuterium, a halogen, a substituted or unsubstituted C1 to 010 aliphatic organic group, or a substituted or unsubstituted C6 to C20 aromatic organic group, n11 and n14 to n20 are independently an integer ranging from 0 to 4, and n12, n13, n21, and n22 are independently an integer ranging from 0 to 3.

Group A of Chemical Formula 1 may be selected from chemical formulae of Group 2:

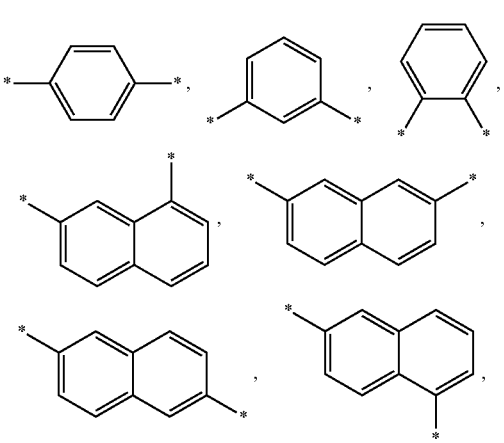

Group 2

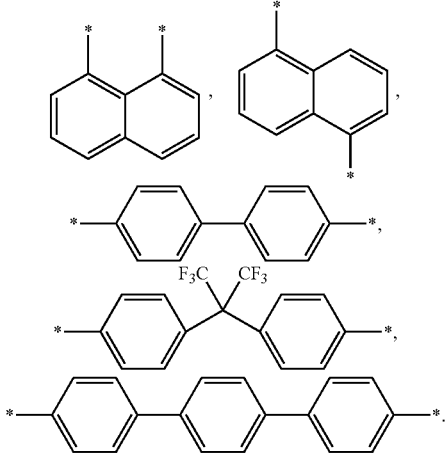

Group B of Chemical Formula 1 may be represented by Chemical Formula 6:

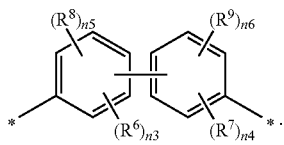

Chemical Formula 6

In Chemical Formula 6, $R^6$ and $R^7$ are the same or different and are independently an electron withdrawing group, $R^8$ and $R^9$ are the same or different and are independently an alkoxy group (—$OR^{204}$, wherein $R^{204}$ is a C1 to C10 aliphatic organic group), a silyl group (—$SiR^{205}R^{206}R^{207}$, wherein $R^{205}$, $R^{206}$, and $R^{207}$ are the same or different and are independently hydrogen, or a 01 to 010 aliphatic organic group), a substituted or unsubstituted C1 to 010 aliphatic organic group, or a C6 to C20 aromatic organic group, n3 is an integer ranging from 1 to 4, n5 is an integer ranging from 0 to 3, and n3+n5 is an integer of 4 or less, and n4 is an integer ranging from 1 to 4, n6 is an integer ranging from 0 to 3, and n4+n6 is an integer of 4 or less.

$R^6$ and $R^7$ are the same or different and are independently —$CF_3$, —$CCl_3$, —$CBr_3$, —$Cl_3$, —F, —Cl, —Br, —I, —$NO_2$, —CN, —$COCH_3$, or —$CO_2C_2H_5$.

Group D of Chemical Formulae 2 and 3 may independently be selected from chemical formulae of Group 3:

Group 3

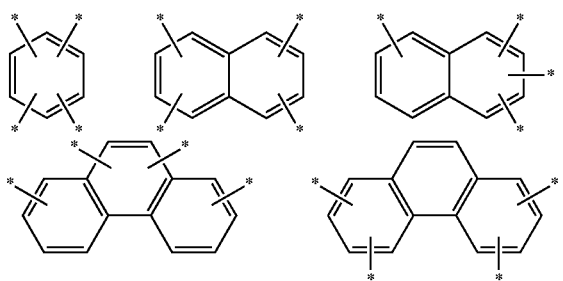

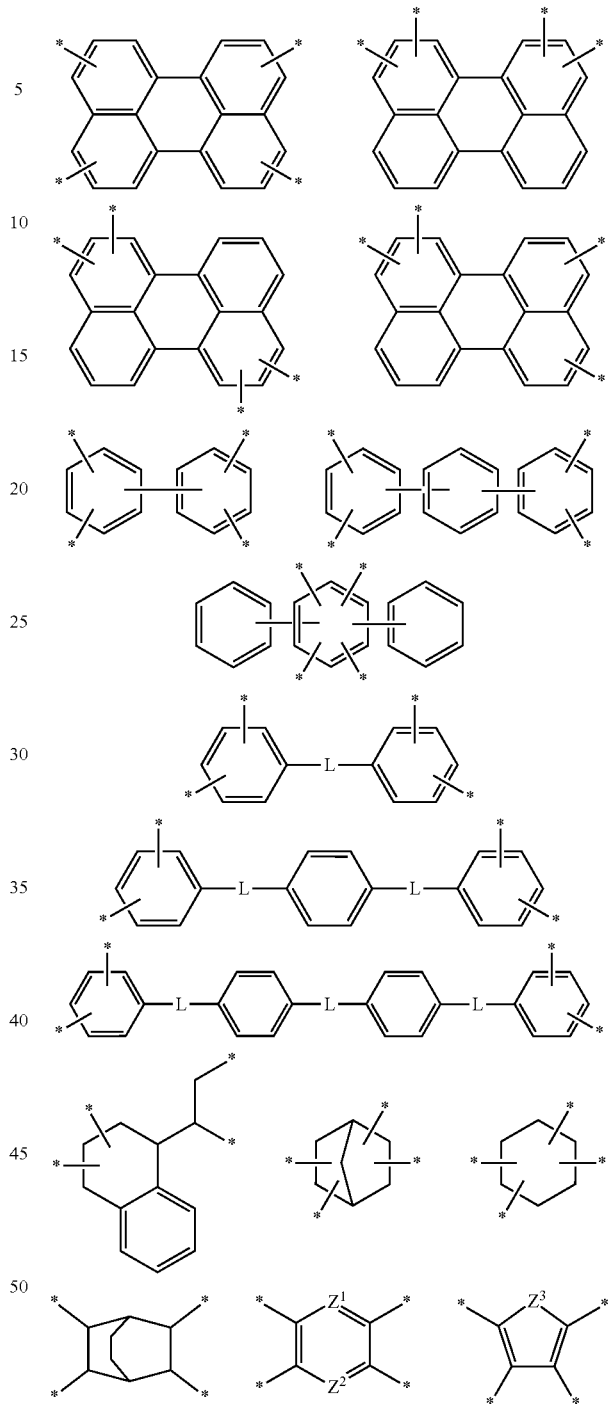

In the chemical formulae, each residual group may be substituted or unsubstituted, each L may be the same or different and are independently a direct bond, —O—, —S—, —C(=O)—, —CH(OH)—, —S(=O)$_2$—, —Si(CH$_3$)$_2$—, —(CH$_2$)$_p$— (wherein 1≤p≤10), (CF$_2$)$_q$ (wherein 1≤q≤10), —CR"R'"— (wherein R" and R'" are independently hydrogen, a C1 to C10 aliphatic hydrocarbon group, a C6 to C20 aromatic hydrocarbon group, or a C6 to C20 alicyclic hydrocarbon group), —C(CF$_3$)$_2$—, —C(CF$_3$)(C$_6$H$_5$)—, or —C(=O)NH—,

* is a linking point to an adjacent atom, $Z^1$ and $Z^2$ are the same or different and are independently —N= or $C(R^{100})$=, wherein $R^{100}$ is hydrogen or a C1 to C5 alkyl group, provided that $Z^1$ and $Z^2$ are not simultaneously —$C(R^{100})$=, and $Z^3$ is —O—, —S—, or —$NR^{101}$— wherein $R^{101}$ is hydrogen or a C1 to C5 alkyl group.

Group D of Chemical Formulae 2 and 3 may independently be selected from Chemical formulae of Group 4:

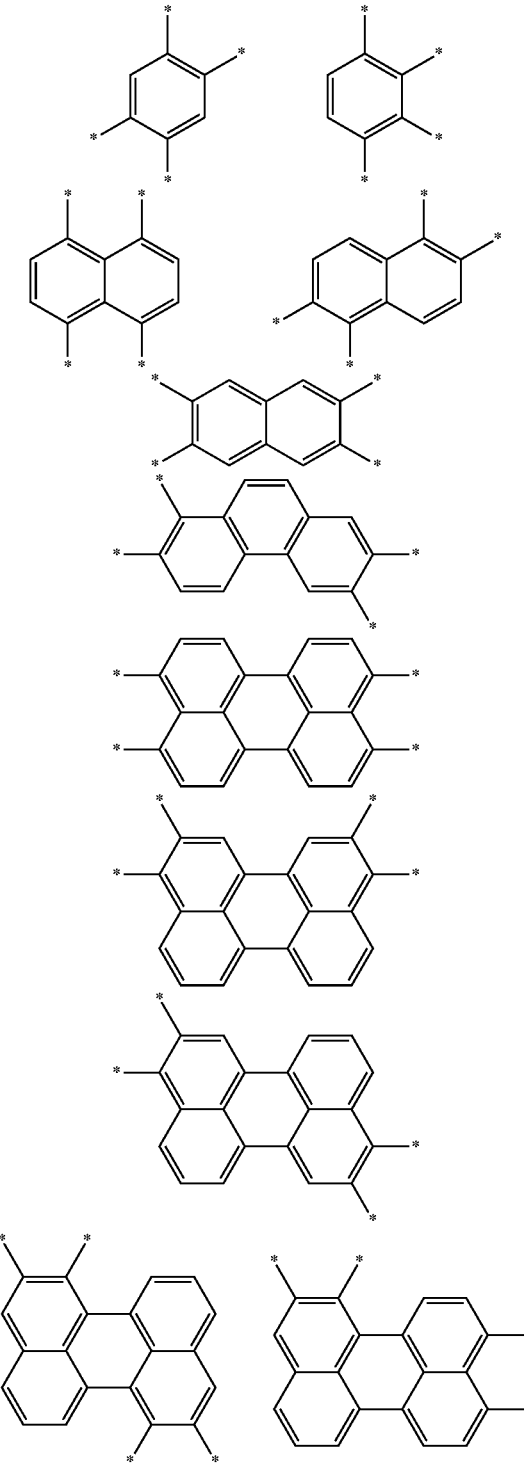

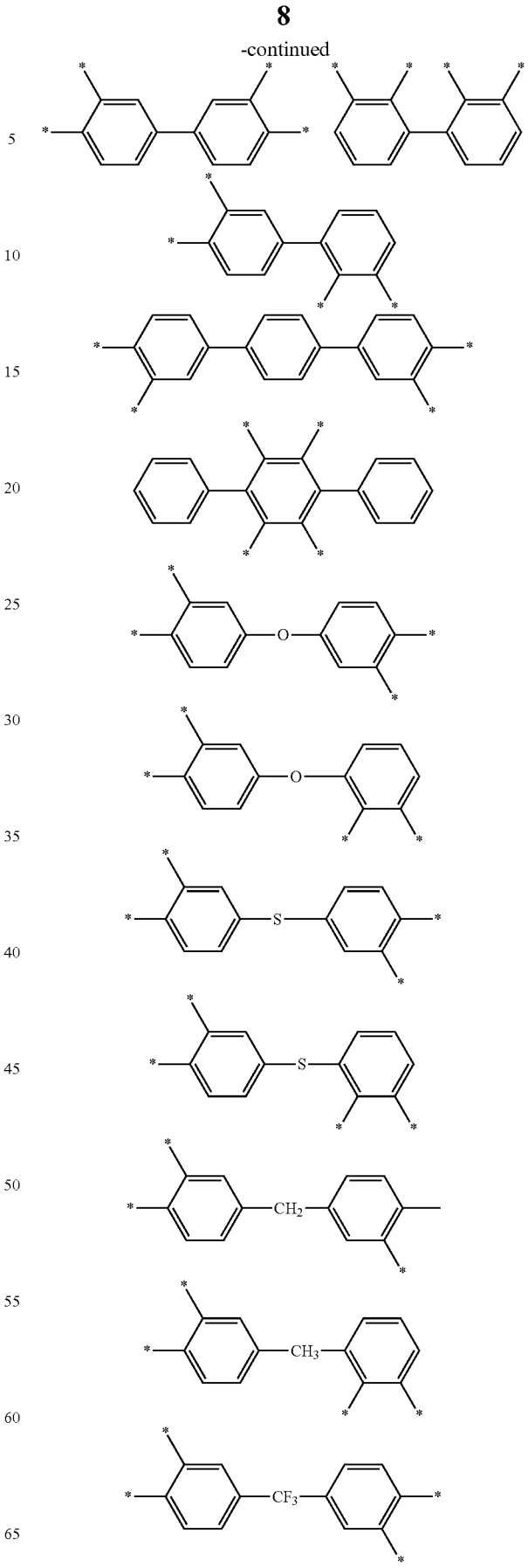

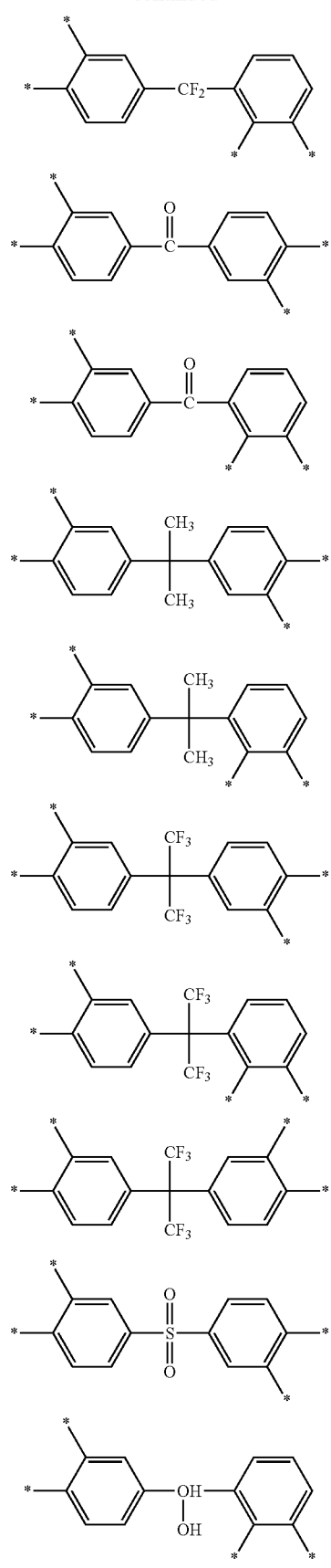
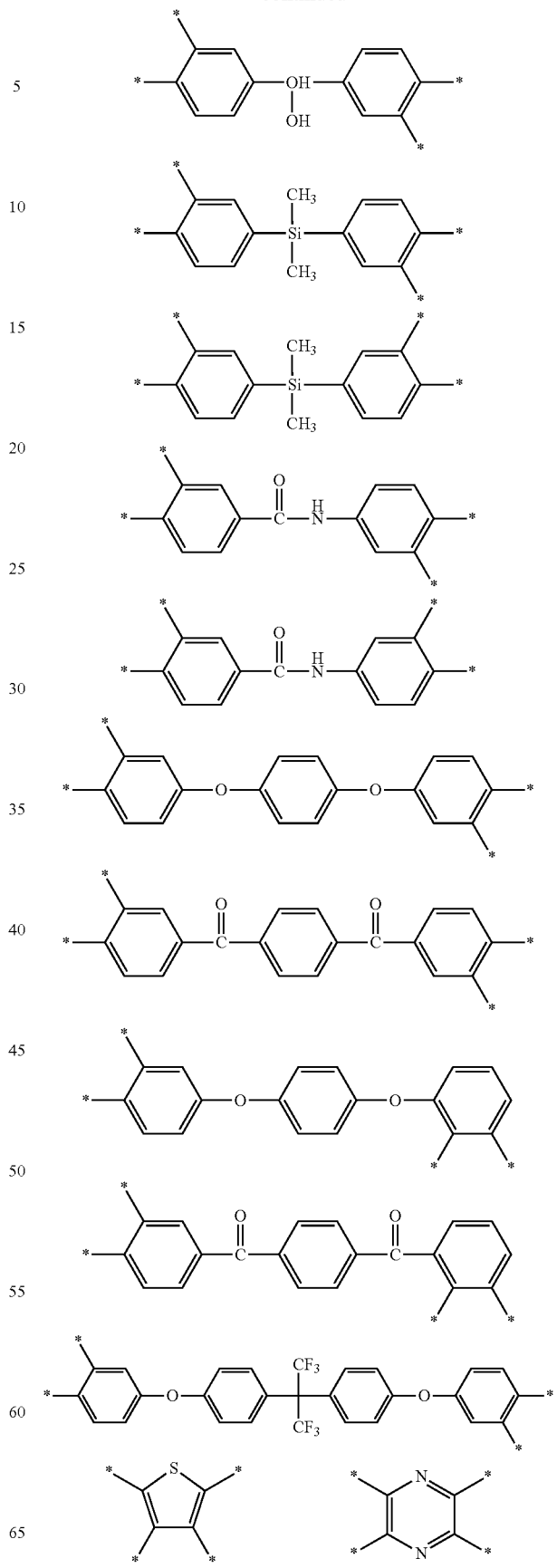

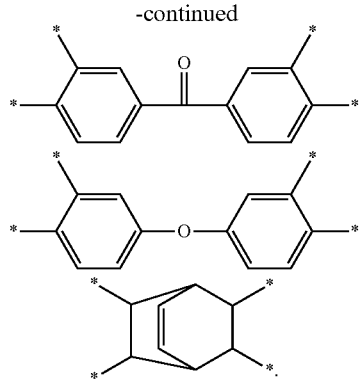

Group E of Chemical Formulae 2 and 3 may represented by Chemical Formula 6:

Chemical Formula 6

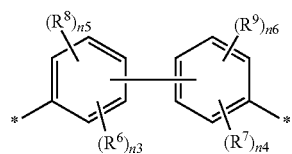

In Chemical Formula 6, $R^6$ and $R^7$ are the same or different and are independently an electron withdrawing group, $R^8$ and $R^9$ are the same or different and are independently an alkoxy group (—$OR^{204}$, wherein $R^{204}$ is a C1 to C10 aliphatic organic group), a silyl group (—$SiR^{205}R^{206}R^{207}$, wherein $R^{205}$, $R^{206}$, and $R^{207}$ are the same or different and are independently hydrogen or a C1 to C10 aliphatic organic group), a substituted or unsubstituted a C1 to C10 aliphatic organic group, or a C6 to C20 aromatic organic group, n3 is an integer ranging from 1 to 4, n5 is an integer ranging from 0 to 3, and n3+n5 is an integer of 4 or less, and n4 is an integer ranging from 1 to 4, n6 is an integer ranging from 0 to 3, and n4+n6 is an integer of 4 or less.

$R^6$ and $R^7$ may be the same or different and may independently be —$CF_3$, —$CCl_3$, —$CBr_3$, —$Cl_3$, —F, —Cl, —Br, —I, —$NO_2$, —CN, —$COCH_3$, or —$CO_2C_2H_5$.

The structural unit represented by Chemical Formula 1 may include one or more of structural units represented by Chemical Formula 7 to Chemical Formula 9:

Chemical Formula 7

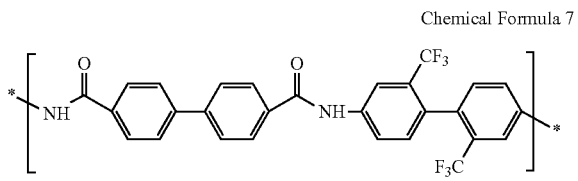

Chemical Formula 8

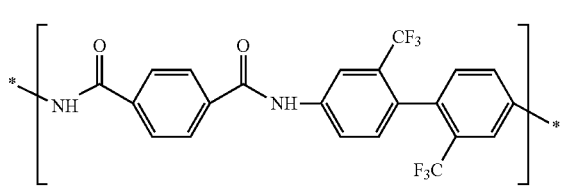

Chemical Formula 9

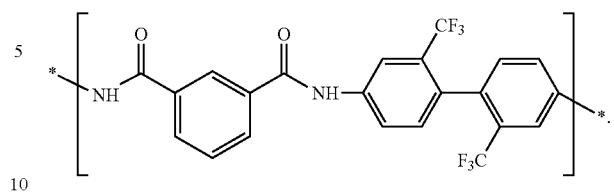

The structural unit represented by Chemical Formula 2 may include one or more of structural units represented by Chemical Formula 10 and Chemical Formula 11:

Chemical Formula 10

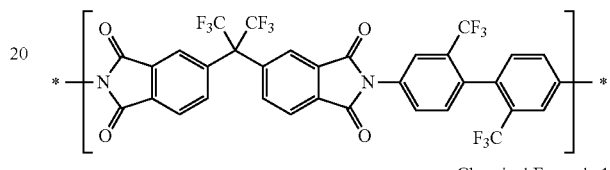

Chemical Formula 11

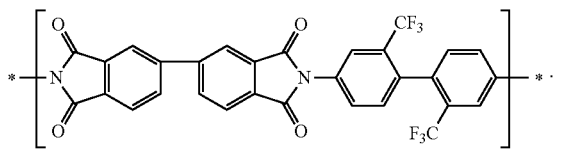

The composition for preparing an organic/inorganic hybrid poly(amide-imide) copolymer may include about 10 parts by weight or less of the polyhedral oligomeric silsesquioxane based on 100 parts by weight of the copolymer of the poly(amide-imide) copolymer, the poly(amide-amic acid) copolymer, the poly(amide-amic acid/imide) copolymer, or a combination thereof.

The composition for preparing an organic/inorganic hybrid poly(amide-imide) copolymer may include greater than about 3 parts by weight and less than about 10 parts by weight of the polyhedral oligomeric silsesquioxane based on 100 parts by weight of the copolymer of the poly(amide-imide) copolymer, the poly(amide-amic acid) copolymer, the poly(amide-amic acid/imide) copolymer, or a combination thereof.

The composition for preparing an organic/inorganic hybrid poly(amide-imide) copolymer may include a poly (amide-imide) copolymer including a structural unit represented by Chemical Formula 8, a structural unit represented by Chemical Formula 10, and a structural unit represented by Chemical Formula 11, and a polyhedral oligomeric silsesquioxane represented by Chemical Formula 12:

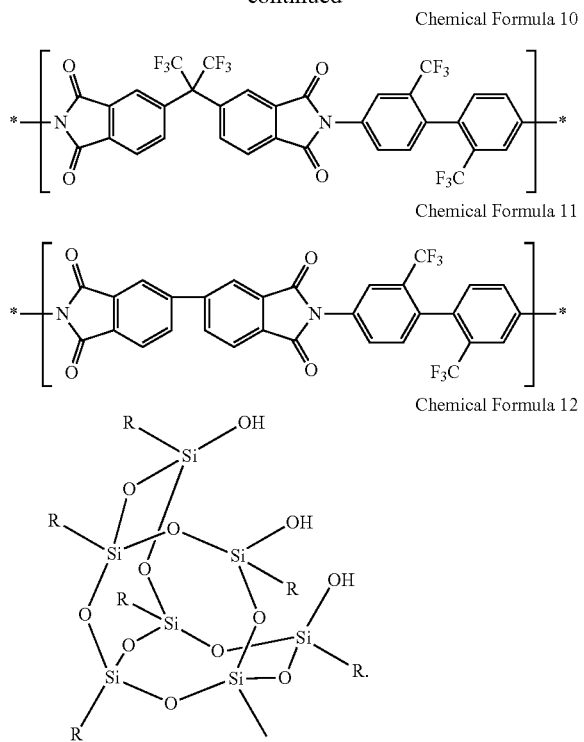

Chemical Formula 10

Chemical Formula 11

Chemical Formula 12

In Chemical Formula 12, R is independently a substituted or unsubstituted C1 to C30 alkyl group, a substituted or unsubstituted C3 to C30 cycloalkyl group, a substituted or unsubstituted C6 to C30 aryl group, or a combination thereof.

The composition for an organic/inorganic hybrid poly (amide-imide) copolymer includes about 60 mole percent or more of the structural unit represented by Chemical Formula 1 and about 40 mole percent or less of the structural unit represented by Chemical Formula 2, the structural unit represented by Chemical Formula 3, or a combination thereof, and the polyhedral oligomeric silsesquioxane may be present in an amount of less than or equal to about 10 parts by weight based on 100 parts by weight of the poly(amide-imide) copolymer.

Another embodiment provides an article manufactured by curing the composition for preparing a poly(amide-imide) copolymer according to the embodiment.

The article may be a film, and may have a yellow index (YI) of about 3.5 or less at a thickness of about 80 micrometers according to an ASTM E313 method, and a tensile modulus of greater than about 4.7 Giga Pascals according to an ASTM D882 method.

Another embodiment provides a display device including the article according to the embodiment.

BRIEF DESCRIPTION OF THE DRAWINGS

These and/or other aspects will become apparent and more readily appreciated from the following description of the exemplary embodiments, taken in conjunction with the accompanying drawings in which.

DETAILED DESCRIPTION

Figure 1:
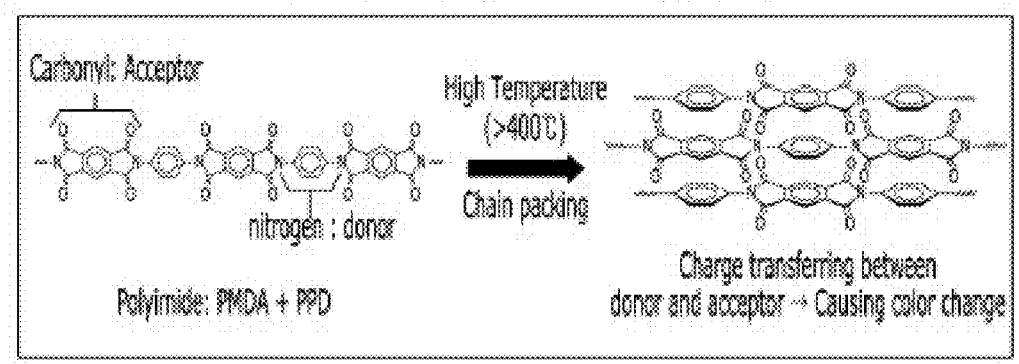
FIG. 1 is a view schematically showing how polyimide chains are packed during a heat treatment at a high temperature of greater than or equal to a glass transition temperature.

Reference will now be made in detail to specific embodiments, examples of which are illustrated in the accompanying drawings, wherein like reference numerals refer to like elements throughout. In this regard, the present exemplary embodiments may have different forms and should not be construed as being limited to the descriptions set forth herein. Accordingly, the exemplary embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "on" another element, it can be directly in contact with the other element or intervening elements may be present therebetween. In contrast, when an element is referred to as being "directly on" another element, there are no intervening elements present.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present embodiments.

The terminology used herein is for the purpose of describing particular embodiments only and is not intended to be limiting. As used herein, the singular forms "a," "an," and "the" are intended to include the plural forms as well, unless the context clearly indicates otherwise.

The term "or" means "and/or." It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Hereinafter, embodiments are described in detail. However, these embodiments are exemplary, and this disclosure is not limited thereto.

As used herein, when specific definition is not otherwise provided, the term "substituted" refers to a compound or group substituted with at least one substituent selected from a halogen (—F, —Cl, —Br, or —I), a hydroxy group, a nitro group, a cyano group, an amino group ($NH_2$, $NH(R^{100})$, or $N(R^{101})(R^{102})$, wherein $R^{100}$, $R^{101}$, and $R^{102}$ are the same or different, and are independently a C1 to C10 alkyl group), an amidino group, a hydrazine group, a hydrazone group, a carboxyl group, an ester group, a ketone group, a substituted or unsubstituted alkyl group, a substituted or unsubstituted alicyclic organic group (e.g., a cycloalkyl group), a substituted or unsubstituted aryl group (e.g., a benzyl group, a naphthyl group, or a fluorenyl group), a substituted or unsubstituted alkenyl group, a substituted or unsubstituted alkynyl group, a substituted or unsubstituted heteroaryl group, and a substituted or unsubstituted heterocyclic group, instead of at least one hydrogen of the given functional group, and the substituents may be linked to each other to provide a ring.

As used herein, when specific definition is not otherwise provided, the term "alkyl group" refers to a C1 to C30 alkyl group, for example a C1 to C15 alkyl group, the term "cycloalkyl group" refers to a C3 to C30 cycloalkyl group, for example C3 to C18 cycloalkyl group, the term "alkoxy group" refers to a C1 to C30 alkoxy group, for example C1 to C18 alkoxy group, the term "ester group" refers to a C2 to C30 ester group, for example a C2 to C18 ester group, the term "ketone group" refers to a C2 to C30 ketone group, for example a C2 to C18 ketone group, the term "aryl group" refers to a C6 to C30 aryl group, for example a C6 to C18 aryl group, and the term "alkenyl group" refers to a C2 to C30 alkenyl group, for example a C2 to C18 alkenyl group.

As used herein, when a definition is not otherwise provided, the term "alkyl" indicates a group derived from a completely saturated, branched or unbranched (or a straight or linear) hydrocarbon and having a specified number of carbon atoms.

As used herein, when a definition is not otherwise provided, the term "cycloalkyl" indicates a monovalent group having one or more saturated rings in which all ring members are carbon.

As used herein, when a definition is not otherwise provided, the term "aryl" indicates an aromatic hydrocarbon containing at least one ring and having the specified number of carbon atoms.

As used herein, when specific definition is not otherwise provided, the term "combination" refers to mixing or copolymerization. Herein, "copolymerization" refers to random copolymerization, block copolymerization, or graft copolymerization.

As used herein, a term "polyimide" does not refer to only "polyimide" but may refer to "polyimide", "polyamic acid", or a combination thereof. In addition, the "polyimide" may be the same as "polyamic acid," and thus, they may be used to have same meaning.

As used herein, "*" refers to a linking part between the same or different atoms, or chemical formulae.

An embodiment provides a composition for preparing an organic/inorganic hybrid poly(amide-imide) copolymer including a poly(amide-imide) copolymer, a poly(amide-amic acid) copolymer, or a poly(amide-imide/amic acid) copolymer including a structural unit represented by Chemical Formula 1; and a structural unit represented by Chemical Formula 2, a structural unit represented by Chemical Formula 3, or a combination thereof, and a polyhedral oligomeric silsesquioxane (POSS) including a functional group capable of forming a hydrogen bond (hydrogen bonding):

Chemical Formula 1

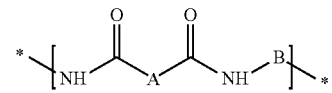

In Chemical Formula 1,

A and B are independently a substituted or unsubstituted divalent C6 to C24 aliphatic cyclic group, a substituted or unsubstituted C6 to C24 aromatic ring group or a substituted or unsubstituted divalent C4 to C24 hetero aromatic ring group, wherein the C6 to C24 aliphatic cyclic group, the C6 to C24 aromatic ring group, or the C4 to C24 hetero aromatic ring group is present as a single ring, or two or more rings thereof are fused to each other to provide a condensed ring system, or two or more of the single ring or the condensed ring are linked through a single bond, a fluorenylene group, —O—, —S—, —C(=O)—, —CH(OH)—, —S(=O)$_2$—, —Si(CH$_3$)$_2$—, —(CH$_2$)$_p$— (wherein 1≤p≤10), —(CF$_2$)$_q$— (wherein 1≤q≤10), —CR"R"'— (wherein R" and R"' are independently hydrogen, a C1 to C10 aliphatic hydrocarbon group, a C6 to C20 aromatic hydrocarbon group, or a C6 to C20 alicyclic hydrocarbon group), —C(CF$_3$)$_2$—, —C(CF$_3$)(C$_6$H$_5$)—, or —C(=O)NH—, Chemical Formula 2

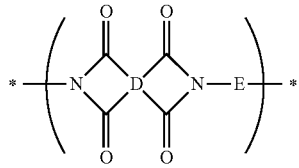

Chemical Formula 3

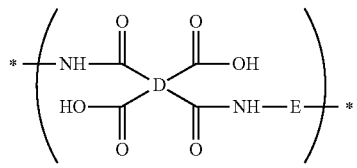

In Chemical Formulae 2 and 3,

D is a substituted or unsubstituted tetravalent C6 to C24 aliphatic cyclic group, a substituted or unsubstituted C6 to C24 aromatic ring group, or a substituted or unsubstituted tetravalent C4 to C24 hetero aromatic ring group, the C6 to C24 aliphatic cyclic group, the C6 to C24 aromatic ring group, or the C4 to C24 hetero aromatic ring group is present as a single ring, two or more rings thereof are fused to each other to provide a condensed ring system, two or more of the single ring or the condensed ring are linked through a single bond, —O—, —S—, —C(=O)—, —CH(OH)—, —S(=O)$_2$—, —Si(CH$_3$)$_2$—, —(CH$_2$)$_p$— (wherein 1≤p≤10), —(CF$_2$)$_q$— (wherein 1≤q≤10), —CR"R'"— (wherein R" and R'" are independently hydrogen, a C1 to C10 aliphatic hydrocarbon group, a C6 to C20 aromatic hydrocarbon group, or a C6 to C20 alicyclic hydrocarbon group), —C(CF$_3$)(C$_6$H$_5$)—, or —C(=O)NH—, and E is a substituted or unsubstituted divalent C6 to C24 aliphatic cyclic group, a substituted or unsubstituted C6 to C24 aromatic ring group or a substituted or unsubstituted divalent C4 to C24 hetero aromatic ring group, the C6 to C24 aliphatic cyclic group, the C6 to C24 aromatic ring group, or the C4 to C24 hetero aromatic ring group is present as a single ring, or two or more rings thereof are fused to each other to provide a condensed ring system, or two or more of the single ring or the condensed ring are linked through a single bond, a fluorenylene group, —O—, —S—, —C(=O)—, —CH(OH)—, —S(=O)$_2$—, —Si(CH$_3$)$_2$—, —(CH$_2$)$_p$— (wherein 1≤p≤10), —(CF$_2$)$_q$— (wherein 1≤q≤10), —CR"R'"— (wherein R" and R'" are independently hydrogen, a C1 to C10 aliphatic hydrocarbon group, a C6 to C20 aromatic hydrocarbon group, or a C6 to C20 alicyclic hydrocarbon group), —C(CF$_3$)$_2$—, —C(CF$_3$)(C$_6$H$_5$)—, or —C(=O)NH—.

As described above, the composition for preparing an organic/inorganic hybrid poly(amide-imide) copolymer according to an embodiment includes a poly(amide-imide/amic acid) copolymer including the amide structural unit represented by Chemical Formula 1 and the imide/amic acid structural units represented by Chemical Formulae 2 and/or 3, and the polyhedral oligomeric silsesquioxane, and in an example embodiment, the composition may be a mixture of the poly(amide-imide/amic acid) copolymer and the polyhedral oligomeric silsesquioxane. In other words, the composition for preparing an organic/inorganic hybrid poly(amide-imide) copolymer may be prepared by adding the polyhedral oligomeric silsesquioxane to a solution including the poly(amide-imide/amic acid) copolymer after preparing the poly(amide-imide/amic acid) copolymer. For example, the composition for preparing an organic/inorganic hybrid poly(amide-imide) copolymer may be obtained by preparing the copolymer by reacting monomers forming the imide structural unit and the amide structural unit, for example, reacting diamine, dianhydride, and dicarboxylic acid derivative, chemically and/or thermally imidizing the copolymer (if necessary, to prepare a partially or completely imidized poly(amide-imide) copolymer), adding the polyhedral oligomeric silsesquioxane to the solution including the copolymer, and simply stirring the mixture with a physical stirrer such as an overhead stirrer. Herein, the polyhedral oligomeric silsesquioxane may be well dissolved in the solution including the copolymer.

The silsesquioxane may have a 'cage' shape having tetrahedral Si vertexes and Si—O—Si groups as an organic silicon compound represented by Chemical Formula (RSiO$_{3/2}$)$_n$ (wherein R may be hydrogen or a substituent such as alkyl, alkoxy, and the like). The cage-shaped silsesquioxane is 'polyhedral oligomeric silsesquioxane (POSS)', which may have a polyhedron shape wherein the n may be 8, 10, 12, and the like. Among the polyhedral oligomeric silsesquioxanes, hexahedral oligomeric silsesquioxane represented by Chemical Formula 13 is the most known:

Chemical Formula 13

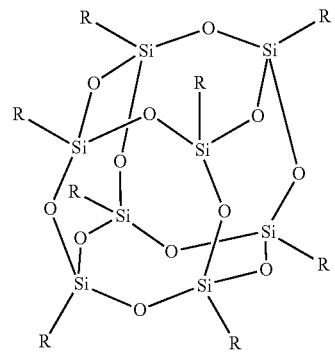

As shown in the structure of Chemical Formula 13, the polyhedral oligomeric silsesquioxane may have an organic/inorganic hybrid shape, wherein a substituent of an organic material is attached to silicon atoms on the outside of the case, thereby introducing various functional groups into a Si vertex.

On the other hand, the polyhedral oligomeric silsesquioxane may include a partially condensed polyhedral oligomeric silsesquioxane that does not have a completely condensed cage shape as Chemical Formula 13, but is a partially open polyhedron. The partially condensed open polyhedral oligomeric silsesquioxane may be prepared by adjusting the amount of a reactant, a catalyst, a reaction condition, and the like, in such a way that at least one —Si—O—Si— group of the completely condensed polyhedral oligomeric silsesquioxane, such as the compound represented by Chemical Formula 13, is not linked but cleaved, thus forming an open structure.

Examples of the partially condensed polyhedral oligomeric silsesquioxane may be a hexahedron oligomer silsesquioxane represented by Chemical Formula 4 or Chemical Formula 5:

Chemical Formula 4

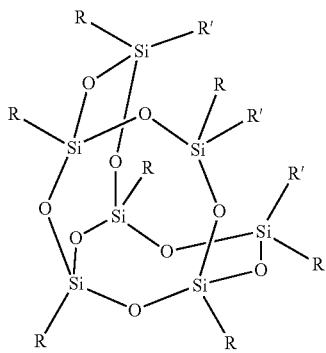

Chemical Formula 5

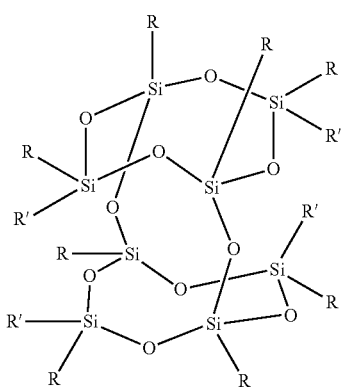

In Chemical Formulae 4 and 5, R and R' are each independently various organic functional groups, which may be introduced by various known methods in this arts.

In an embodiment, a composition is provided by mixing a polyhedral oligomeric silsesquioxane, which is partially or completely condensed, with a poly(amide-imide) copolymer, where the polyhedral oligomeric silsesquioxane includes a functional group capable of hydrogen bonding. An article prepared from the composition shows excellent mechanical and optical properties, such as increased mechanical strength and decreased yellow index compared with the article prepared from a poly(amide-imide) copolymer that does not include a polyhedral oligomeric silsesquioxane.

In addition, the polyhedral oligomeric silsesquioxane obtained by introducing the functional group capable of hydrogen bonding may well dissolve in a solution including the poly(amide-imide) copolymer. In addition, the functional group capable of hydrogen bonding introduced into the polyhedral oligomeric silsesquioxane may have a hydrogen bond with a polar element capable of hydrogen bonding in the copolymer, for example, an element such as oxygen or nitrogen in the copolymer. Accordingly, the polyhedral oligomeric silsesquioxane and the poly(amide-imide) copolymer may be well mixed through simple stirring.

The functional group capable of hydrogen bonding may be —OH, —SH, or —NH$_2$, and these functional groups form a hydrogen bond with an amino group (—NH$_2$) in the poly(amide-imide) copolymer, thereby making the polyhedral oligomeric silsesquioxane well dispersed in the copolymer.

In an example embodiment, R of Chemical Formulae 4 and 5 may independently be a substituted or unsubstituted C1 to C30 alkyl group, a substituted or unsubstituted C3 to C30 cycloalkyl group, a substituted or unsubstituted C6 to C30 aryl group, or a combination thereof, and R' may be a functional group capable of hydrogen bonding, for example, independently, —OH, —SH, or —NH$_2$.

In an example embodiment, R of Chemical Formulae 4 and 5 may independently be a substituted or unsubstituted C1 to C12 alkyl group, a substituted or unsubstituted C3 to C10 cycloalkyl group, a substituted or unsubstituted C6 to C12 aryl group, or a combination thereof, and R' may independently be —OH, —SH, or —NH$_2$.

In an example embodiment, In Chemical Formulae 4 and 5, R may independently be a cyclohexyl group or a phenyl group, and each R' may be —OH.

When R of Chemical Formulae 4 and 5 includes a functional group, the composition for preparing an organic/inorganic hybrid poly(imide-amide) copolymer including Chemical Formula 4 or 5 may not have a negative influence on excellent mechanical characteristics and/or optical properties of the copolymer.

For example, an article such as a film and the like formed of the composition for preparing the organic/inorganic hybrid poly(imide-amide) copolymer may have much higher mechanical strength and further excellent optical properties, for example, a much lower yellow index, than an article such as a film and the like formed of a composition which does not contain the polyhedral oligomeric silsesquioxane including a functional group capable of hydrogen bonding.

The polyimide or poly(amide-imide) copolymer may be used as a display substrate material due to high light transmittance, thermal stability, mechanical strength, and flexibility. However, in general, the manufacture of a display device necessarily requires a high temperature process carried out at greater than or equal to about 350° C., such as a high temperature deposition, high temperature annealing, and the like. When the polyimide or poly(amide-imide) copolymer is heat-treated at this high temperature of greater than or equal to a glass transition temperature, polyimide or poly(amide-imide) molecules may be freely rearranged, and thus polymer chains may be packed. Herein, as shown in FIG. 1, since an electron donor is positioned close to an electron acceptor, the polyimide or poly(amide-imide) copolymer has a structure referred to be a charge transfer complex (CTC), and accordingly, a polyimide or poly (amide-imide) film formed thereof may absorb light in a particular short wavelength region due to an electron movement (excitation) among potential formed therein. Accordingly, transmittance in a blue region of a 400 nanometers (nm) region, which is necessary for manufacturing a display, may be substantially deteriorated, and the film may appear yellow. This phenomenon is referred to be 'yellowness' due to a heat treatment at a high temperature, which makes it difficult to apply the polyimide film to manufacturing a transparent device necessarily requiring a high temperature process.

According to an embodiment, the composition for preparing an organic/inorganic hybrid poly(amide-imide) copolymer includes a polyhedral oligomeric silsesquioxane along with a poly(amide-imide) copolymer, and the polyhedral oligomeric silsesquioxane may be uniformly distributed among polymer chains of the polyimide or poly(imide-amide) copolymer, since a functional group capable of hydrogen bonding, such as —OH, —SH, or —NH$_2$ group, introduced into the polyhedral oligomeric silsesquioxane forms a hydrogen bond with a polar atom, such as nitrogen or oxygen atom, included in the polymer chains of the poly(amide-imide) copolymer, as described above. Accordingly, the polymer chains are effectively prevented from being packed, and thus suppressed from forming the charge transfer complex (CTC). Accordingly, the composition for preparing an organic/inorganic hybrid poly(amide-imide) copolymer including the polyhedral oligomeric silsesquioxane may further increase short wavelength transmittance of an article formed therefrom, such as a film and the like, and provide a much transparent film.

In addition, since the polyhedral oligomeric silsesquioxane is based on an inorganic material, mechanical properties, such as, for example, surface hardness of the organic/inorganic hybrid poly(amide-imide) copolymer film including the inorganic material may be improved compared with a film formed of only an organic material.

In order to improve mechanical properties of the organic material film, there is an attempt to disperse inorganic material particles such as silica and the like, or to bind the inorganic material particles with a polymer backbone through a chemical bond. However, since the inorganic material particles are almost neither dissolved in an organic solvent including an organic material, such as a polymer and the like, nor dispersed, a method of binding the inorganic particles, such as silica and the like, with a polymer through the chemical bond requires a complex process.

On the contrary, the polyhedral oligomeric silsesquioxane including a functional group capable of forming hydrogen bond is well dissolved in an organic solvent including the copolymer though a simple mixing with a mechanical stirrer and the like. The functional group capable of hydrogen bonding, such as —OH, —SH, or —NH$_2$, facilitates dispersion of the polyhedral oligomeric silsesquioxane among the polymer chains of the poly(amide-imide) copolymer. As a result, as described below in the Examples, an organic/inorganic hybrid poly(amide-imide) composite film including the polyhedral oligomeric silsesquioxane including a functional group capable of forming hydrogen bond may be suppressed from CTC formation of the poly(amide-imide) copolymer, and thus has excellent optical characteristics, such as a low yellow index, and simultaneously, high mechanical properties, such as a high tensile modulus, high pencil hardness, and high Marten's hardness (HM).

Figure 4:
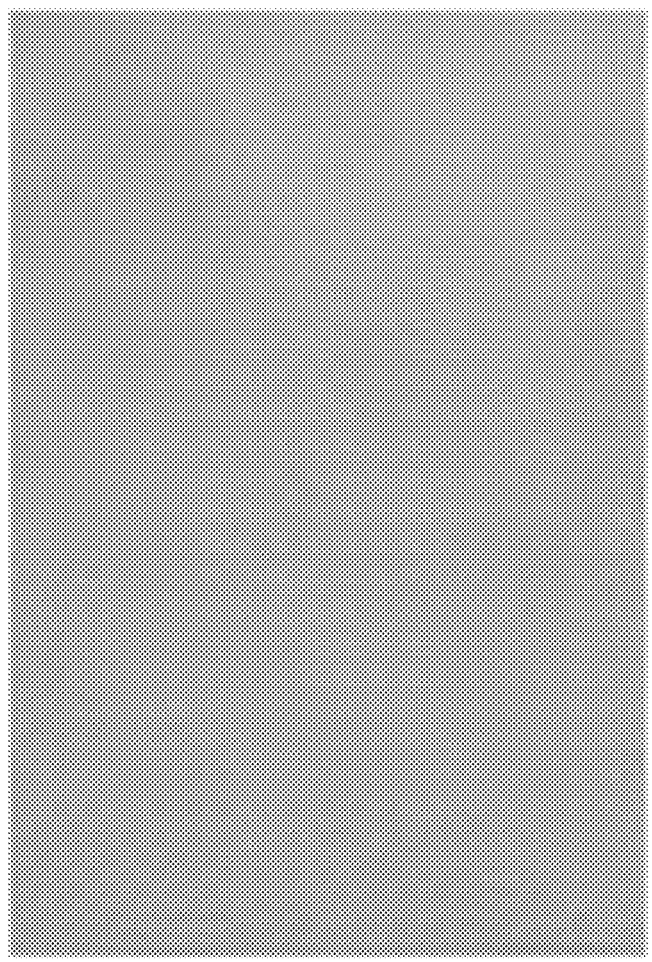
FIG. 4 is a photograph showing the organic/inorganic hybrid composite film according to Example 4.
Figure 5:
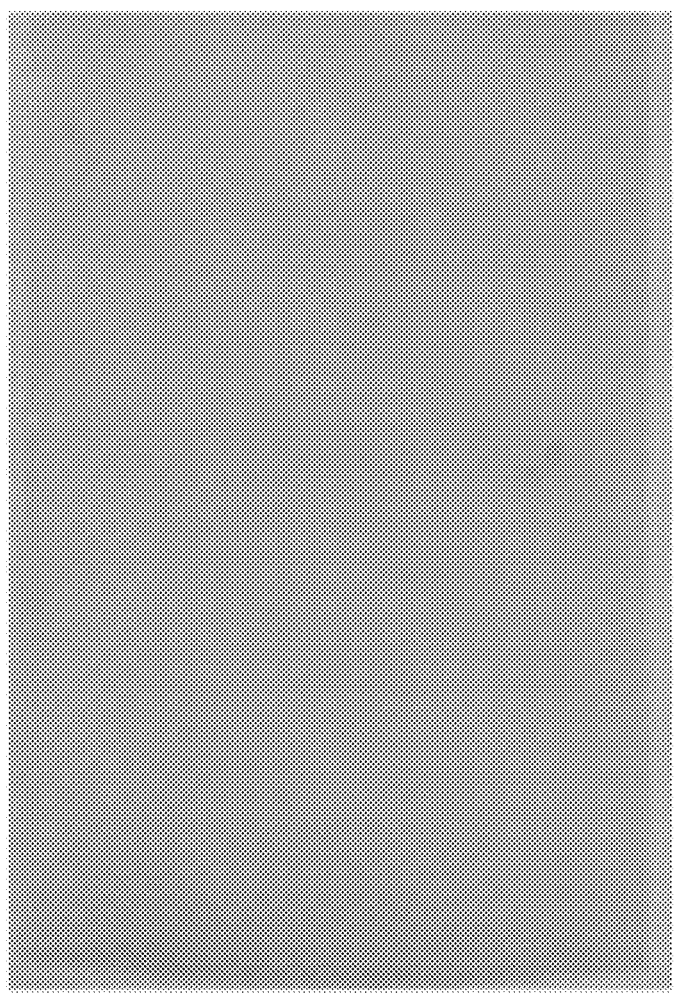
FIG. 5 is a photograph showing the organic/inorganic hybrid composite film according to Example 8.
Figure 6:
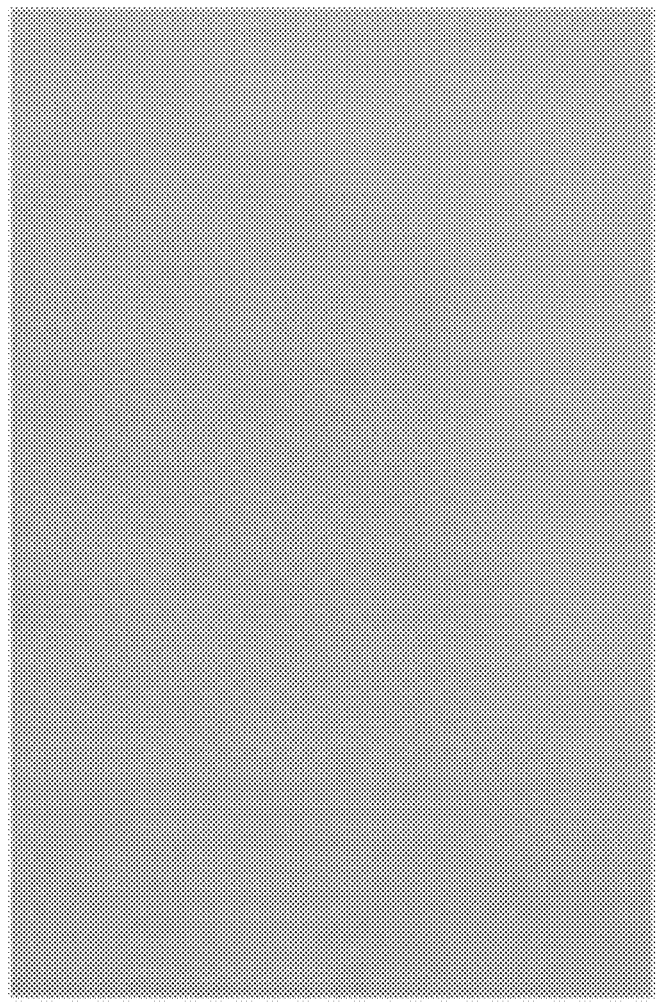
FIG. 6 is a photograph showing the organic/inorganic hybrid composite film according to Comparative Example 2.
Figure 7:
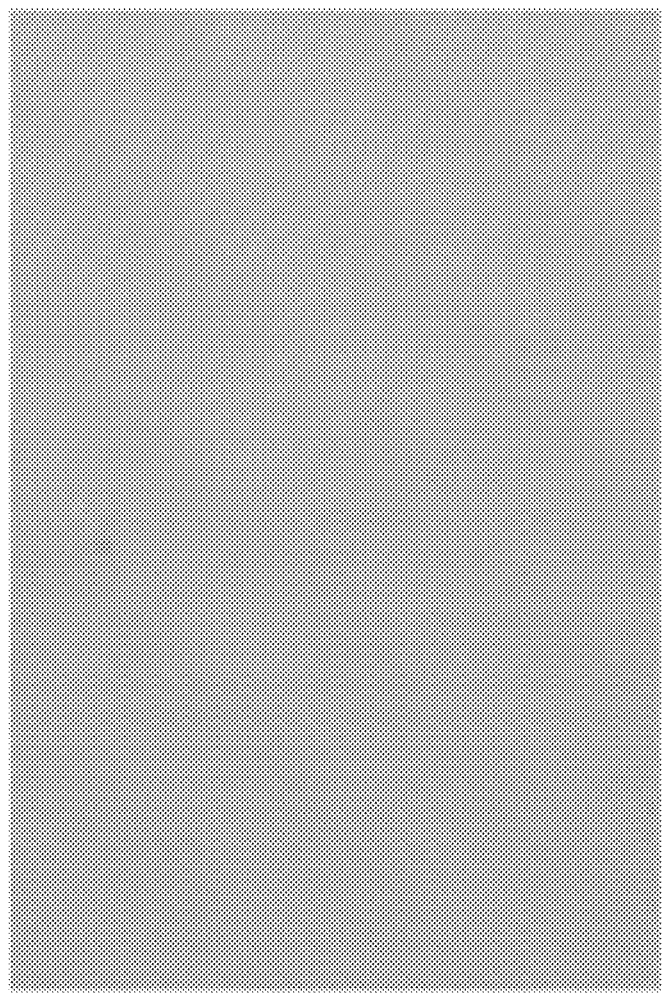
FIG. 7 is a photograph showing the organic/inorganic hybrid composite film according to Comparative Example 3.

On the other hand, a polyhedral oligomeric silsesquioxane, which does not have a functional group capable of forming hydrogen bond, forms a yellow and not transparent but opaque film as shown in the films according to Comparative Examples 2 and 3, and illustrated in FIGS. 6 and 7. The films of Comparative Examples 2 and 3 are remarkable different from the films of Examples 4 and 8, as shown in FIGS. 4 and 5. In other words, the organic/inorganic hybrid composite film including a polyhedral oligomeric silsesquioxane that does not have a functional group capable of forming hydrogen bond cannot improve optical properties unlike the film including the polyhedral oligomeric silsesquioxane including a functional group capable of forming hydrogen bond.

On the other hand, the tensile modulus (Young's Modulus) is a transformation ratio relative to stress, which may be expressed as strength taken until a material such as a film and the like is pulled in a horizontal direction and broken, and thus, may represent, so called, 'strength' of a particular material.

The pencil hardness is obtained by placing each pencil having various hardness values with a slant degree of 45° on the surface of the material, applying a normalized load in a vertical direction at a predetermined speed to scratch the surface of the material, and examining whether a scratch is generated thereon. The hardest pencil hardness is 9H, the pencil hardness is decreased down to 8H and 7H, and the lowest pencil hardness may be 6B.

The Marten's hardness is a method of evaluating mechanical characteristics by using a maximum depth and strength measured, while a pyramid-shaped penetrator is pressed in with a predetermined load and time on the surface of the material. In other words, the Marten's hardness may be used to examine surface hardness of the material.

A film formed by curing the composition for preparing an organic/inorganic hybrid poly(amide-imide) copolymer according to the embodiment shows higher tensile modulus, pencil hardness, and Marten's hardness than a film formed of a poly(amide-imide) copolymer not including the polyhedral oligomeric silsesquioxane including a functional group capable of forming hydrogen bond, and accordingly, the polyhedral oligomeric silsesquioxane may not only improve optical characteristics of the poly(amide-imide) copolymer but also increase mechanical properties.

The polyhedral oligomeric silsesquioxane including a functional group capable of forming hydrogen bond may be present in an amount of about 10 parts by weight or less based on 100 parts by weight of solid content of the poly(amide-imide) copolymer. When the polyhedral oligomeric silsesquioxane is used within the range, both optical characteristics and mechanical properties of the poly(amide-imide) copolymer may increase as described above. When the polyhedral oligomeric silsesquioxane is included in an amount of greater than about 10 parts by weight, the tensile modulus of a molded article formed thereof tends to decrease.

In an example embodiment, the polyhedral oligomeric silsesquioxane may be present in an amount of greater than about 3 parts by weight and less than about 10 parts by weight, for example, about 4 parts by weight to about 8 parts by weight based on 100 parts by weight of solid content of the poly(amide-imide) copolymer. While not wishing to be bound by theory, it is believed that within the above ranges, the composition according to the embodiment may further improve optical characteristics and mechanical properties.

In an example embodiment, when the polyhedral oligomeric silsesquioxane within the above ranges is included in a composition for an organic/inorganic hybrid poly(amide-imide) copolymer, and the composition is used to form a 80 micrometer (μm)-thick film, the film has less than about 3.5 of YI measured by an ASTM E313 method, for example, less than or equal to about 3.0 of YI.

In an example embodiment, the R of Chemical Formula 4 or Chemical Formula 5 may independently be a C1 to C6 alkyl group, a C3 to C6 cycloalkyl group, or a C6 to C12 aryl group, for example, a methyl group, an ethyl group, a propyl group, a butyl group, a pentyl group, a hexyl group, a cyclopropyl group, a cyclobutyl group, a cyclopentyl group, a cyclohexyl group, a phenyl group, or a naphthalene group, and R' may independently be —OH, —SH, —NH$_2$, or a combination thereof.

The poly(amide-imide) copolymer of the composition for an organic/inorganic hybrid poly(amide-imide) copolymer may be any poly(imide/amic acid-amide) copolymer including the amide structural unit represented by Chemical Formula 1 and the imide and/or amic acid structural unit represented by Chemical Formula 2 and/or Chemical Formula 3.

In an example embodiment, Group A of Chemical Formula 1 may be selected from chemical formulae of Group 1:

Group 1

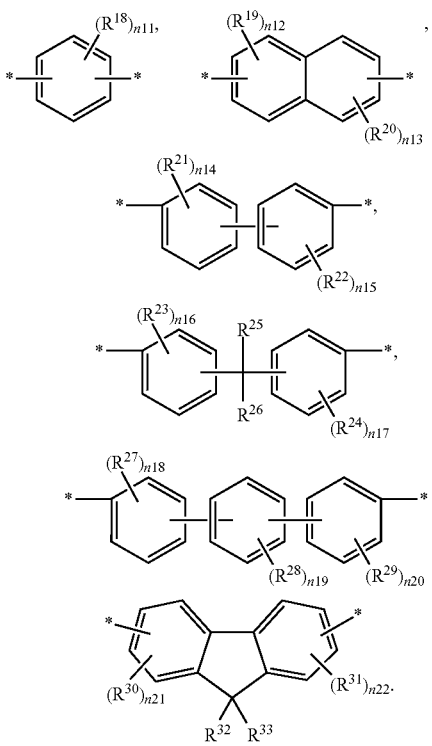

In the above chemical formulae, $R^{18}$ to $R^{33}$ are the same or different and are independently deuterium, a halogen, a substituted or unsubstituted C1 to C10 aliphatic organic group, or a substituted or unsubstituted C6 to C20 aromatic organic group, n11 and n14 to n20 are independently an integer ranging from 0 to 4, and n12, n13, n21, and n22 are independently an integer ranging from 0 to 3.

In an example embodiment, chemical formulae represented by Group 1 may be, for example, represented by chemical formulae represented by Group 2, but are not limited thereto:

Group 2

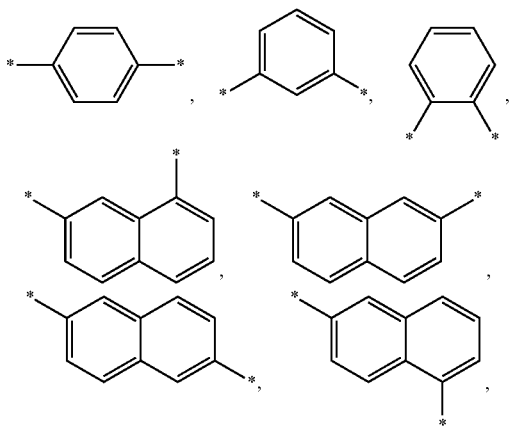

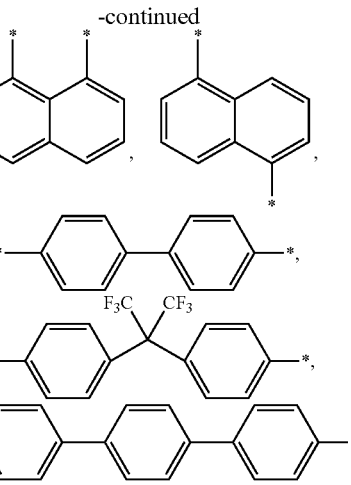

Group B of Chemical Formula 1 may be represented by Chemical Formula 6:

Chemical Formula 6

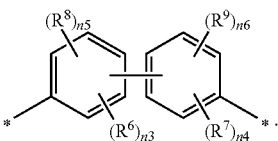

In Chemical Formula 6, $R^6$ and $R^7$ are the same or different and are independently an electron withdrawing group, for example, $-CF_3$, $-CCl_3$, $-CBr_3$, $-Cl_3$, $-F$, $-Cl$, $-Br$, $-I$, $-NO_2$, $-CN$, $-COCH_3$ or $-CO_2C_2H_5$, $R^8$ and $R^9$ are the same or different and are independently an alkoxy group ($-OR^{204}$, wherein $R^{204}$ is a C1 to C10 aliphatic organic group), a silyl group ($-SiR^{205}R^{206}R^{207}$, wherein $R^{205}$, $R^{206}$, and $R^{207}$ are the same or different and are independently hydrogen, or a C1 to C10 aliphatic organic group), a substituted or unsubstituted C1 to C10 aliphatic organic group, or C6 to C20 aromatic organic group, n3 is an integer ranging from 1 to 4, n5 is an integer ranging from 0 to 3, and n3+n5 is an integer of 4 or less, and n4 is an integer ranging from 1 to 4, n6 is an integer ranging from 0 to 3, and n4+n6 is an integer of 4 or less.

Group D of Chemical Formulae 2 and 3 may be selected from chemical formulae of Group 3:

Group 3

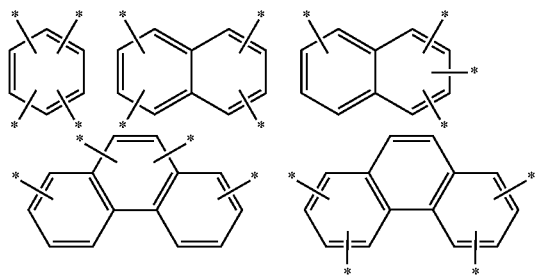

-continued

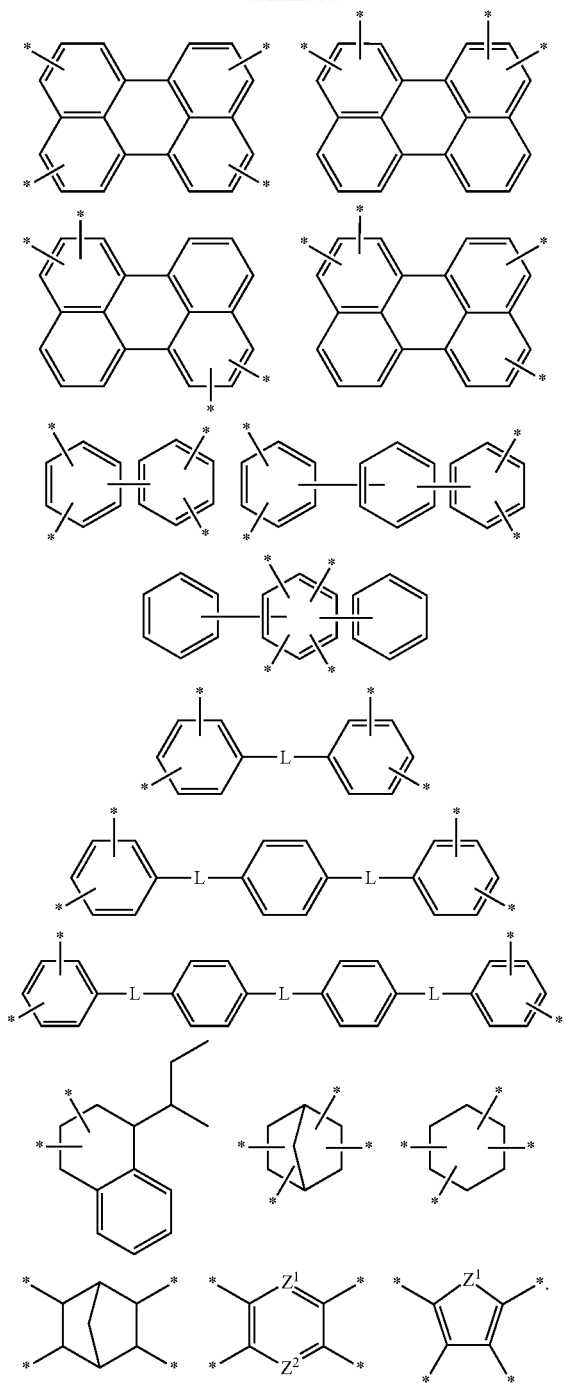

In the above chemical formulae, each residual group may be substituted or unsubstituted, each L may be same or different and may independently be a direct bond, —O—, —S—, —C(=O)—, —CH(OH)—, —S(=O)$_2$—, —Si(CH$_3$)$_2$—, —(CH$_2$)$_p$— (wherein 1≤p≤10), (CF$_2$)$_q$ (wherein 1≤q≤10), —CR"R'"— (wherein R" and R'" are independently hydrogen, a C1 to C10 aliphatic hydrocarbon group, a C6 to C20 aromatic hydrocarbon group, or a C6 to C20 alicyclic hydrocarbon group), —C(CF$_3$)$_2$—, —C(CF$_3$)(C$_6$H$_5$)—, or —C(=O)NH—, and

* is a linking point to an adjacent atom,

Z$^1$ and Z$^2$ are the same or different and are independently —N= or C(R$^{100}$)=, wherein R$^{100}$ is hydrogen or a C1 to C5 alkyl group, provided that Z$^1$ and Z$^2$ are not simultaneously —C(R$^{100}$)=, and Z$^3$ is —O—, —S—, or —NR$^{101}$— wherein R$^{101}$ is hydrogen or a C1 to C5 alkyl group.

The chemical formulae represented by Group 3 may be represented by chemical formulae of Group 4, but are not limited thereto:

Group 4

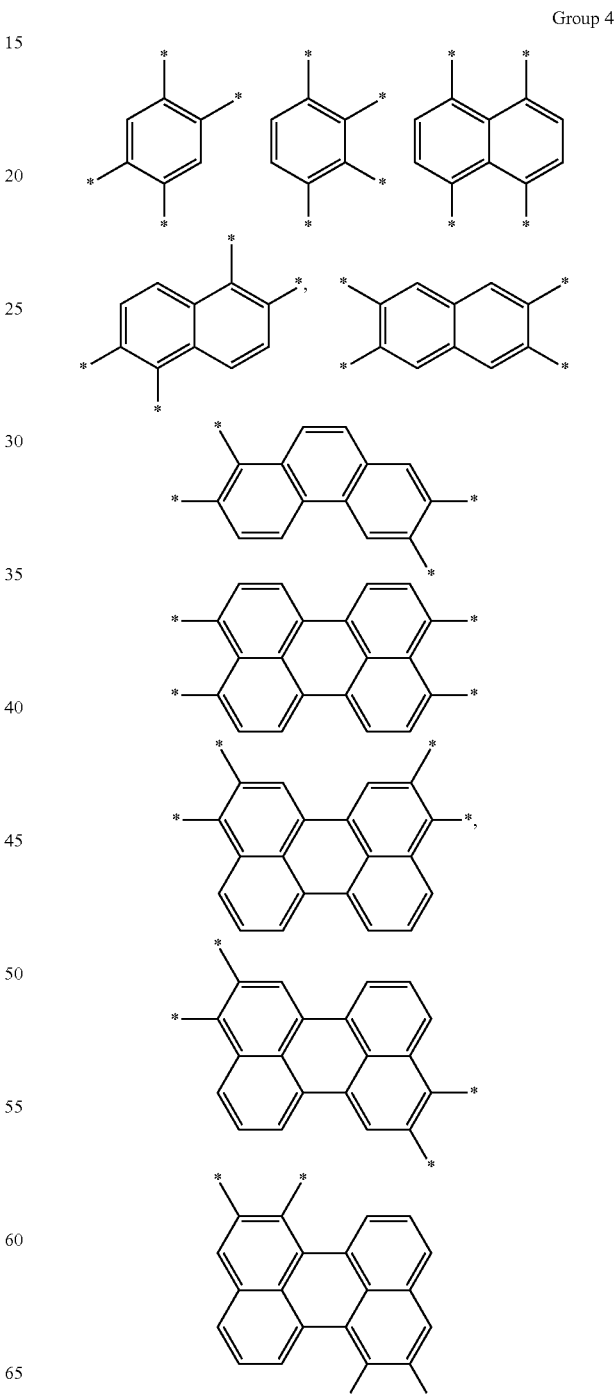

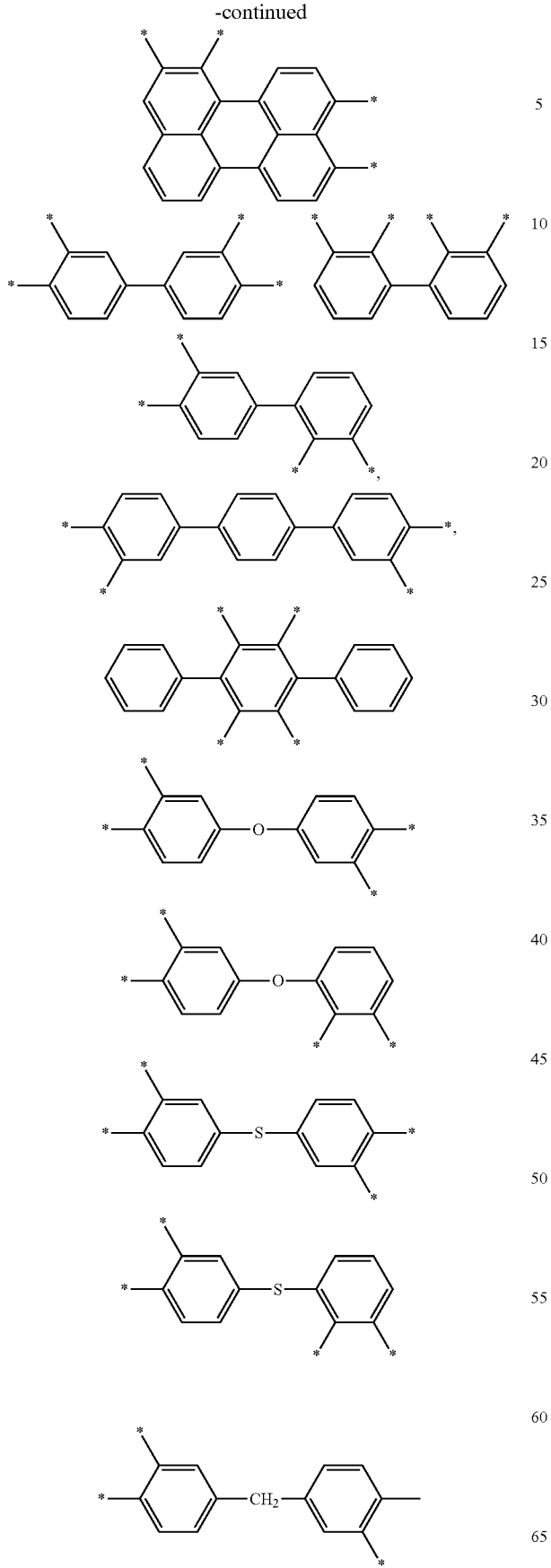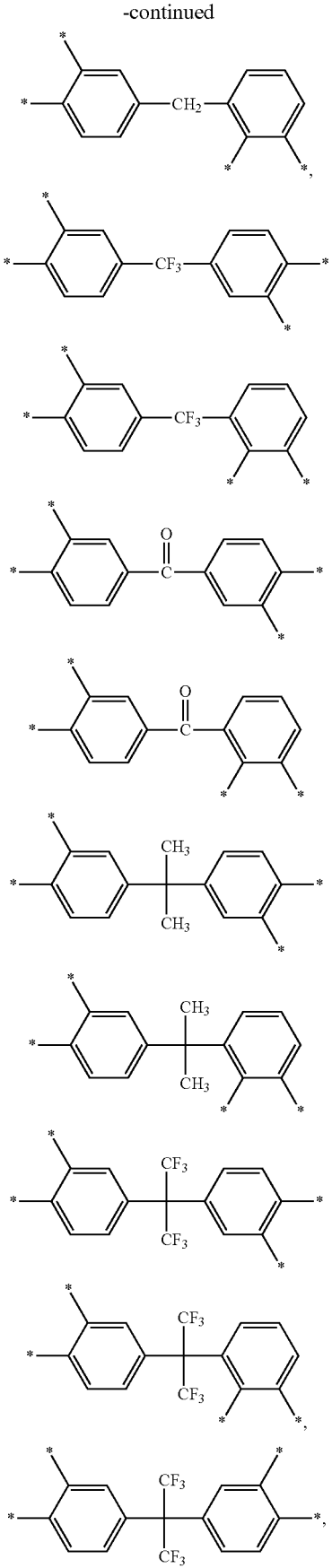

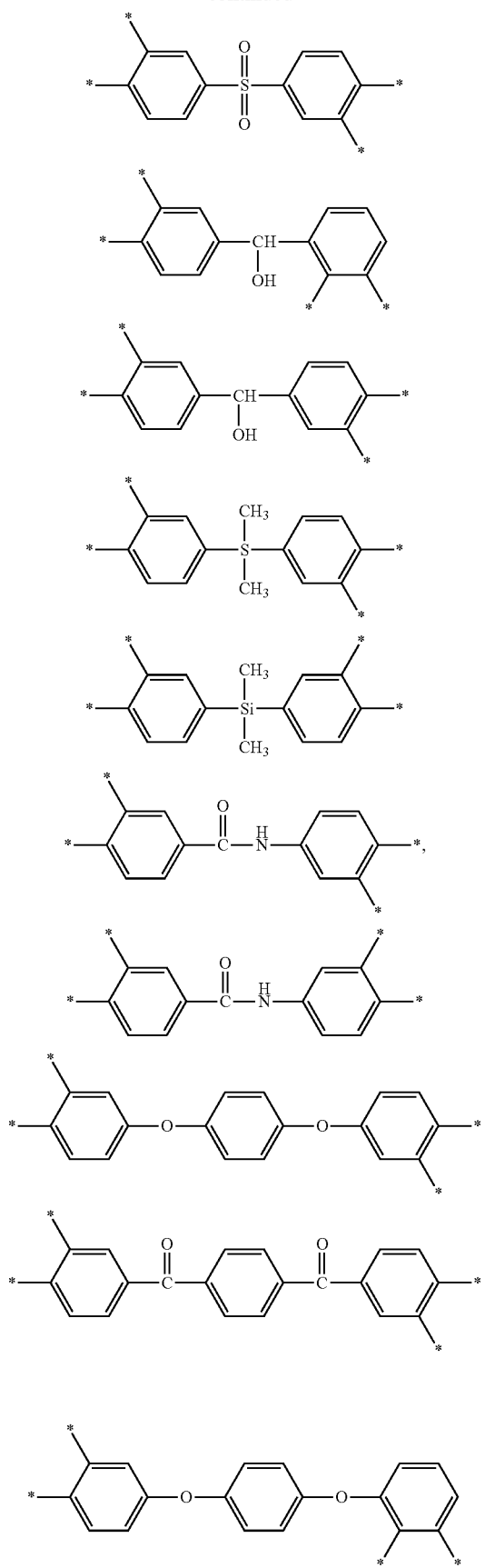

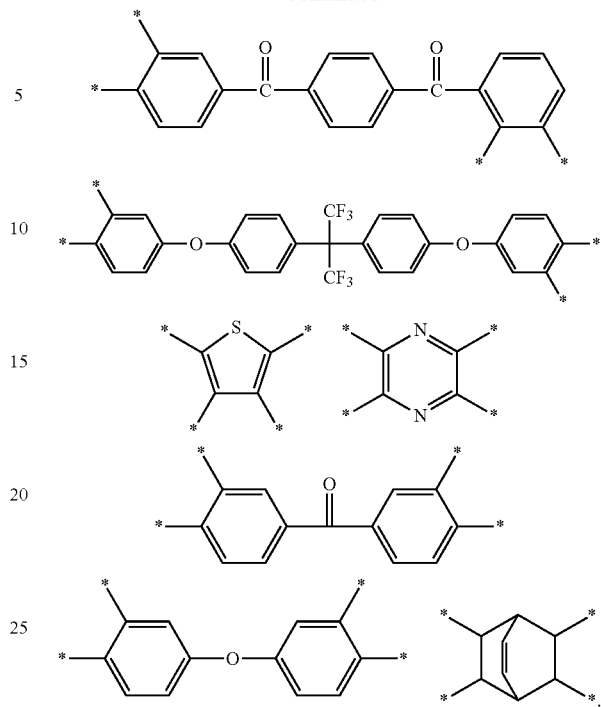

Group E of Chemical Formulae 2 and 3 may be represented by Chemical Formula 6, the same as B of Chemical Formula 1:

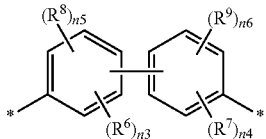

Chemical Formula 6

In Chemical Formula 6, $R^6$ to $R^9$ and n3 to n6 are the same as defined as above.

In an example embodiment, the structural unit represented by Chemical Formula 1 may include one or more of structural units represented by Chemical Formula 7 to Chemical Formula 9:

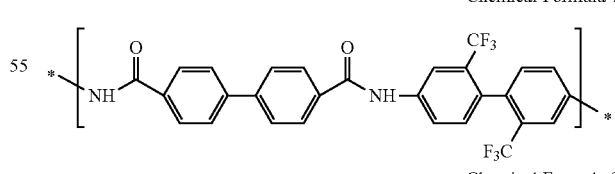

Chemical Formula 7

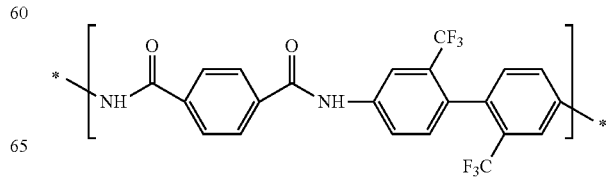

Chemical Formula 8

Chemical Formula 9

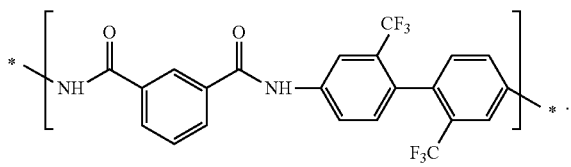

In an example embodiment, the structural unit represented by Chemical Formula 2 may include one or more of structural units represented by Chemical Formula 10 and Chemical Formula 11:

Chemical Formula 10

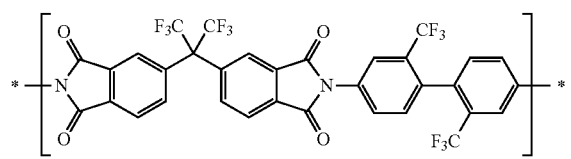

Chemical Formula 11

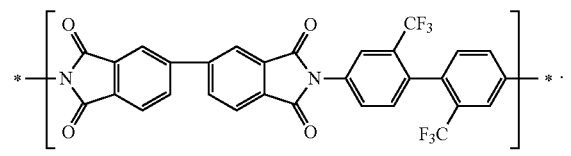

In an example embodiment, the composition for preparing an organic/inorganic hybrid poly(amide-imide) copolymer may include a poly(amide-imide) copolymer including a structural unit represented by Chemical Formula 8, a structural unit represented by Chemical Formula 10, and a structural unit represented by Chemical Formula 11, and a polyhedral oligomeric silsesquioxane represented by Chemical Formula 12:

Chemical Formula 8

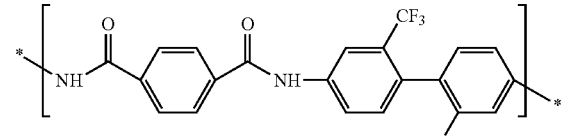

Chemical Formula 10

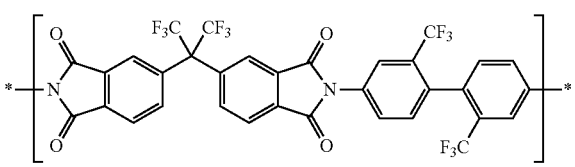

Chemical Formula 11

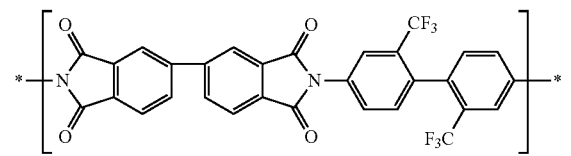

Chemical Formula 12

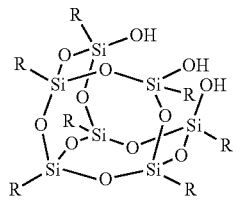

In Chemical Formula 12, R is independently a substituted or unsubstituted C1 to C30 alkyl group, a substituted or unsubstituted C3 to C30 cycloalkyl group, a substituted or unsubstituted C6 to C30 aryl group, or a combination thereof.

In an example embodiment, R of Chemical Formula 12 may be independently a C1 to C10 alkyl group, a C3 to C10 cycloalkyl group, or a C6 to C12 aryl group.

In an example embodiment, R of Chemical Formula 12 may be a C1 to C6 alkyl group, a cyclohexyl group or a phenyl group.

The polyhedral oligomeric silsesquioxane may be readily prepared in various methods well-known in a related art or commercially available as one having a functional group among commercially available various products.

In an example embodiment, the poly(amide-imide) copolymer may include an amide structural unit in the amount of greater than or equal to about 60 mole percent (mol %) and the imide structural unit in an amount of less than or equal to about 40 mol %. While not wishing to be bound by theory, it is understood that when the poly(amide-imide) copolymer includes the amide structural unit and the imide structural unit within the above range, optical and mechanical characteristics of a film including the poly(amide-imide) copolymer may be maintained.

The polyhedral oligomeric silsesquioxane may be present in an amount of less than or equal to about 10 parts by weight based on 100 parts by weight of the copolymer. When the polyhedral oligomeric silsesquioxane is included in an amount of less than or equal to about 10 parts by weight based on 100 parts by weight of the copolymer, an organic/inorganic hybrid poly(amide-imide) copolymer film formed thereof shows much improved optical characteristics and mechanical properties compared with a film formed of only the copolymer.

As described above, when an article, for example, a film obtained by curing the composition for preparing an organic/inorganic hybrid poly(amide-imide) copolymer has a particular thickness, for example, a thickness of about 80 μm, the film has less than or equal to about 3.5 of YI measured with an ASTM E313 method and an increased tensile modulus, pencil hardness, and Marten's hardness compared with a film formed of only a copolymer.

The poly(amide-imide) copolymer having the above structure may be readily prepared by polymerizing monomers in a polyimide and polyamide-manufacturing method well-known in a related art.

For example, the imide structural unit may be prepared by reacting diamine with dianhydride in an organic solvent.

Examples of the diamine compound may include one or more selected from m-phenylene diamine; p-phenylene diamine; 1,3-bis(4-aminophenyl) propane; 2,2-bis(4-aminophenyl) propane; 4,4'-diamino-diphenyl methane; 1,2-bis(4-aminophenyl) ethane; 1,1-bis(4-aminophenyl) ethane; 2,2'-diamino-diethyl sulfide; bis(4-aminophenyl) sulfide; 2,4'-diamino-diphenyl sulfide; bis(3-aminophenyl) sulfone; bis (4-aminophenyl) sulfone; 4,4'-diamino-dibenzyl sulfoxide; bis(4-aminophenyl) ether; bis (3-aminophenyl) ether; bis(4-aminophenyl)diethyl silane; bis(4-aminophenyl) diphenyl silane; bis(4-aminophenyl) ethyl phosphineoxide; bis(4-aminophenyl) phenyl phosphineoxide; bis(4-aminophenyl)-N-phenyl amine; bis(4-aminophenyl)-N-methylamine; 1,2-diamino-naphthalene; 1,4-diamino-naphthalene; 1,5-diamino-naphthalene; 1,6-diamino-naphthalene; 1,7-diamino-naphthalene; 1,8-diamino-naphthalene; 2,3-diamino-naphthalene; 2,6-diamino-naphthalene; 1,4-diamino-2-methyl-naphthalene; 1,5-diamino-2-methyl-naphthalene; 1,3-diamino-2-phenyl-naphthalene; 4,4'-diamino-biphenyl; 3,3'-diamino-biphenyl; 3,3'-dichloro-4,4'-diamino-biphenyl; 3,3'-dimethyl-4,4'-diamino-biphenyl; 3,3'-dimethyl-4,4'-diamino-biphenyl; 2,2'-dimethoxy-4,4'-diamino-biphenyl; 4,4'-bis(4-aminophenoxy)-biphenyl; 2,4-diamino-toluene; 2,5-diamino-toluene; 2,6-diamino-toluene; 3,5-diamino-toluene; 1,3-diamino-2,5-dichloro-benzene; 1,4-diamino-2,5-dichloro-benzene; 1-methoxy-2,4-diamino-benzene; 1,4-diamino-2-methoxy-5-methyl-benzene; 1,4-diamino-2,3,5,6-tetramethyl-benzene; 1,4-bis(2-methyl-4-amino-pentyl)-benzene; 1,4-bis(1,1-dimethyl-5-amino-pentyl)-benzene; 1,4-bis(4-aminophenoxy)-benzene; o-xylylene diamine; m-xylylene diamine; p-xylylene diamine; 3,3'-diamino-benzophenone; 4,4'-diamino-benzophenone; 2,6-diamino-pyridine; 3,5-diamino-pyridine; 1,3-diamino-adamantane; bis[2-(3-aminophenyl)hexafluoroisopropyl] diphenyl ether; 3,3'-diamino-1, 1'-diadamantane; N-(3-aminophenyl)-4-aminobenzamide; 4-aminophenyl-3-aminobenzoate; 2,2-bis(4-aminophenyl) hexafluoropropane; 2,2-bis(3-aminophenyl) hexafluoropropane; 2-(3-aminophenyl)-2-(4-aminophenyl)hexafluoropropane; 2,2-bis[4-(4-aminophenoxy)phenyl] hexafluoropropane; 2,2-bis[4-(2-chloro-4-aminophenoxy)phenyl] hexafluoropropane; 1,1-bis(4-aminophenyl)-1-phenyl-2,2,2-trifluoroethane; 1,1-bis[4-(4-aminophenoxy)phenyl]-1-phenyl-2,2,2-trifluoroethane; 1,4-bis(3-aminophenyl)buta-1-ene-3-yne; 1,3-bis (3-aminophenyl) hexafluoropropane; 1,5-bis (3-aminophenyl) decafluoropentane; and 4,4'-bis[2-(4-aminophenoxyphenyl) hexafluoroisopropyl] diphenyl ether, diaminocyclohexane, bicyclohexyldiamine, 4,4'-diaminocyclodihexylmethane, and diaminofluorene. Such diamine compounds may be commercially available or may be prepared by a well-known method.

For example, the diamine compound may be a compound of the following structures:

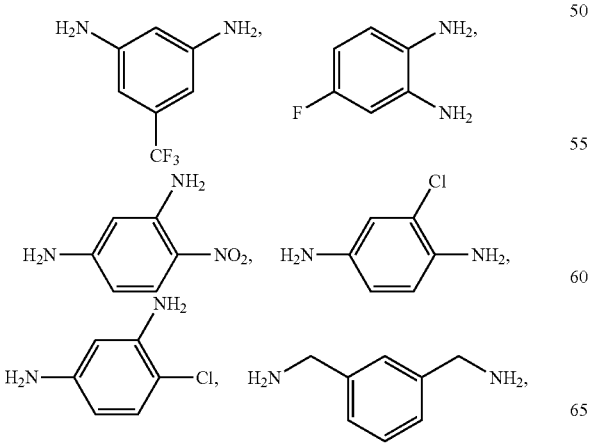

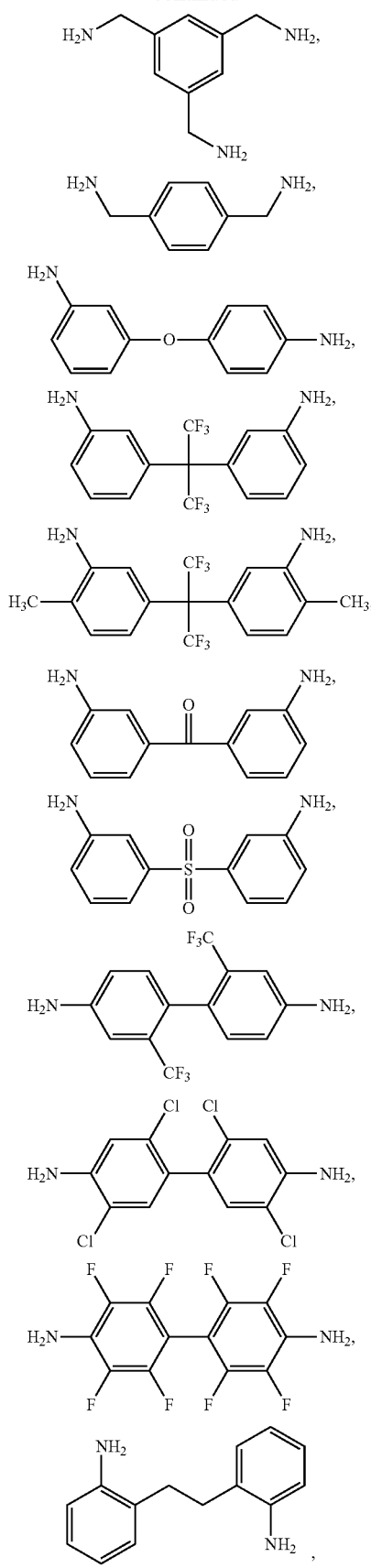

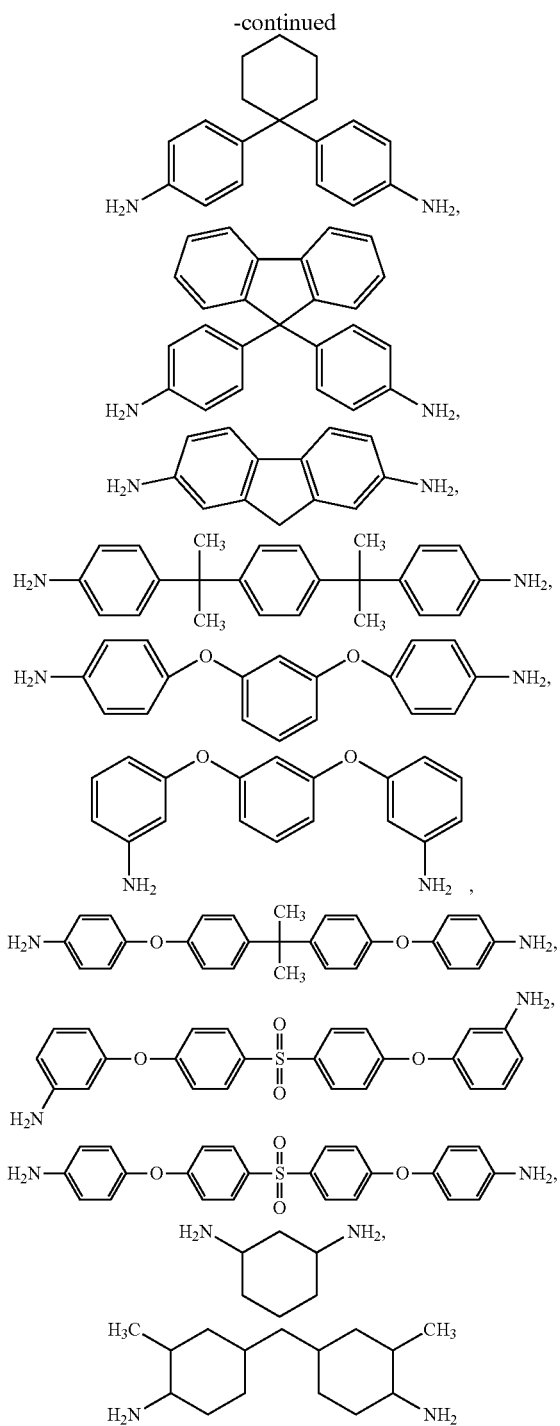

In an example embodiment, the diamine may be 2,2'-bis(trifluoromethyl)benzidine (TFDB).

The dianhydride may be tetracarboxylic dianhydride, and such a compound may be 3,3',4,4'-biphenyl tetracarboxylic dianhydride (BPDA), bicyclo[2.2.2]oct-7-ene-2,3,5,6-tetracarboxylic dianhydride (BTDA), 3,3',4,4'-diphenylsulfone tetracarboxylic dianhydride (DSDA), 4,4'-(hexafluoroisopropylidene)diphthalic anhydride (6FDA), 4,4'-oxydiphthalic anhydride (ODPA), pyromellitic dianhydride (PMDA), 4-(2,5-dioxotetrahydrofuran-3-yl)-1,2,3,4-tetrahydronaphthalene-1,2-dicarboxylic anhydride (DTDA), 1,2,4,5-benzene tetracarboxylic dianhydride; 1,2,3,4-benzene tetracarboxylic dianhydride; 1,4-bis(2,3-dicarboxyphenoxy) benzene dianhydride; 1,3-bis(3,4-dicarboxyphenoxy) benzene dianhydride; 1,2,4,5-naphthalene tetracarboxylic dianhydride; 1,2,5,6-naphthalene tetracarboxylic dianhydride; 1,4,5,8-naphthalene tetracarboxylic dianhydride; 2,3,6,7-naphthalene tetracarboxylic dianhydride; 2,6-dichloronaphthalene-1,4,5,8-tetracarboxylic dianhydride; 2,7-dichloronaphthalene-1,4,5,8-tetracarboxylic dianhydride; 2,3,6,7-tetrachloronaphthalene-1,4,5,8-tetracarboxylic dianhydride; 2,2',3,3'-biphenyl tetracarboxylic dianhydride; 4,4'-bis(3,4-dicarboxyphenoxy)biphenyl dianhydride; bis(2,3-dicarboxylphenyl) ether dianhydride; 4,4'-bis(2,3-dicarboxyphenoxy) diphenyl ether dianhydride; 4,4'-bis(3,4-dicarboxyphenoxy) diphenylether dianhydride; bis(3,4-dicarboxylphenyl) sulfide dianhydride; 4,4'-bis(2,3-dicarboxyphenoxy) diphenyl sulfide dianhydride; 4,4'-bis(3,4-dicarboxyphenoxy) diphenyl sulfide dianhydride; bis(3,4-dicarboxylphenyl) sulfone dianhydride; 4,4'-bis(2,3-dicarboxyphenoxy) diphenylsulfone dianhydride; 4,4'-bis(3,4-dicarboxylphenoxy) diphenylsulfone dianhydride; 3,3',4,4'-benzophenone tetracarboxylic dianhydride; 2,2',3,3'-benzophenone tetracarboxylic dianhydride; 2,3,3'4'-benzophenone tetracarboxylic dianhydride; 4,4'-bis(3,4-dicarboxylphenoxy) benzophenone dianhydride; bis(2,3-dicarboxylphenyl) methane dianhydride; bis(3,4-dicarboxylphenyl) methane dianhydride; 1,1-bis(2,3-dicarboxylphenyl) ethane dianhydride; 1,1-bis(3,4-dicarboxylphenyl) ethane dianhydride; 1,2-bis(3,4-dicarboxylphenyl) ethane dianhydride; 2,2-bis(2,3-dicarboxylphenyl) propane dianhydride; 2,2-bis(3,4-dicarboxylphenyl) propane dianhydride; 2,2-bis[4-(2,3-dicarboxylphenoxy) phenyl] propane dianhydride; 2,2-bis[4-(3,4-dicarboxylphenoxy) phenyl] propane dianhydride; 2,2-[4-(2,3-dicarboxylphenoxy)-4'-(3,4-dicarboxylphenoxy) diphenyl]-propane dianhydride; 2,2-bis[4-(3,4-dicarboxylphenoxy-3,5-dimethyl) phenyl] propane dianhydride; 2,3,4,5-thiophene tetracarboxylic dianhydride; 2,3,5,6-pyrazine tetracarboxylic dianhydride; 1,8,9,10-phenanthrene tetracarboxylic dianhydride; 3,4,9,10-perylene tetracarboxylic dianhydride; 1,3-bis(3,4-dicarboxylphenyl) hexafluoropropane dian hydride; 1,1-bis(3,4-dicarboxylphenyl)-1-phenyl-2,2,2-trifluoroethane dianhydride; 2,2-bis[4-(3,4-dicarboxylphenoxy) phenyl] hexafluoropropane dianhydride; 1,1-bis [4-(3,4-dicarboxylphenoxy) phenyl]-1-phenyl-2,2,2-trifluoro ethane dianhydride; and 4,4'-bis[2-(3,4-dicarboxylphenyl)hexafluoroisopropyl] diphenyl ether dianhydride. Such anhydride compounds may be commercially available or may be obtained by a well-known method.

In an example embodiment, the tetracarboxylic acid dianhydride may be 3,3',4,4'-biphenyl tetracarboxylic dianhydride (BPDA), 4,4'-(hexafluoroisopropylidene) diphthalic anhydride (6FDA), or a mixture thereof.

A well-known polyamide manufacturing method may include low temperature solution polymerization, interface polymerization, fusion polymerization, solid-phase polymerization, and the like. For example, the low temperature solution polymerization may be performed by reacting dicarboxylic dihalide and diamine in an aprotic polar solvent to form the amide structural unit represented by Chemical Formula 1.

The dicarboxylic dihalide may be one or more selected from terephthaloyl chloride (TPCI), isophthaloyl chloride (IPCI), biphenyl dicarbonyl chloride (BPCI), naphthalene dicarbonyl chloride, terphenyl dicarbonyl chloride, 2-fluoroterephthaloyl chloride and a combination thereof.

In an example embodiment, the dicarboxylic dihalide may be terephthaloyl chloride (TPCl).

Diamine for forming the amide structure may be the same diamine compound as used for forming the imide structure. In other words, the amide structure may be formed by using at least one kind of homogenous or heterogeneous diamine among the aforementioned diamine compounds.

In an example embodiment, diamine for forming an amide structure with the dicarboxylic dihalide may be 2,2'-bis(trifluoromethyl)benzidine (TFDB).

The aprotic polar solvent may be, for example, a sulfoxide solvent such as dimethyl sulfoxide, diethyl sulfoxide and the like, a formamide solvent such as N,N-dimethyl formamide, N,N-diethyl formamide, and the like, an acetamide solvent such as N,N-dimethyl acetamide, N,N-diethyl acetamide and the like, a pyrrolidone solvent such as N-methyl-2-pyrrolidone, N-vinyl-2-pyrrolidone and the like, a phenol solvent such as phenol, o-, m- or p-cresol, xylenol, halogenated phenol, catechol, and the like, or hexamethylphosphoramide, γ-butyrolactone, and the like. These may be used alone or as a mixture. However, the solvent is not limited thereto, and an aromatic hydrocarbon such as xylene and toluene may be used.

substrate and the like in a well-known coating method, and subsequently dried and cured by heating to manufacture an article, such as a film and the like.

The method of manufacturing the film is the same as a method of manufacturing a poly(amide-imide) copolymer film not including the polyhedral oligomeric silsesquioxane, and thus will not be illustrated in detail.

As described above, the film shows improved optical characteristics and mechanical properties compared with a film formed of only a poly(amide-imide) copolymer.

Accordingly, the film may be used as a window film and the like for a flexible display device requiring high transparency and surface hardness.

Hereinafter, the present disclosure is illustrated in more detail with reference to examples. However, these examples are exemplary, and the present disclosure is not limited thereto.

EXAMPLE

Synthesis Example 1: Preparation of Amide Structural Unit-Containing Oligomer

An amide structural unit-containing oligomer bonded with diamine TFDB (2,2'-bis(trifluoromethyl)benzidine) at both terminal ends and forming an aramid structure is prepared according to Reaction Scheme 1:

Reaction Scheme 1

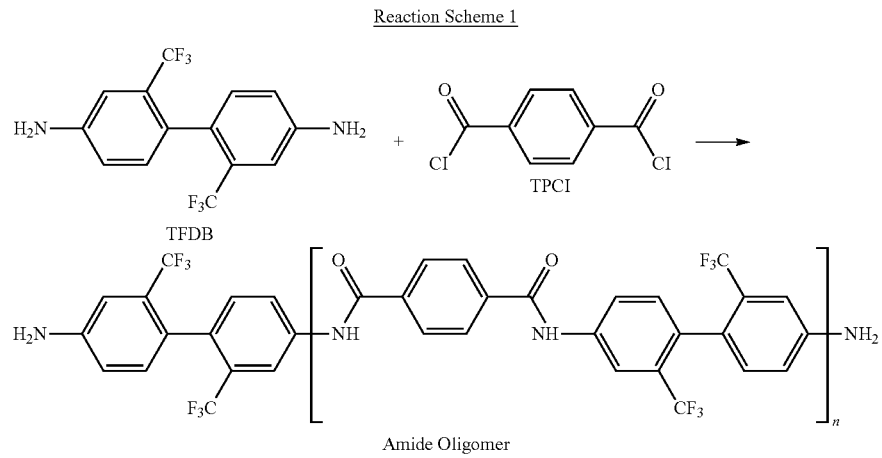

Amide Oligomer

The amide structural unit is formed by reacting a diamine and a dicarboxylic dihalide in the same reactor, followed by the addition and reaction of a diamine and a dianhydride for forming the imide structural unit to prepare preparing a poly(amic acid-amide) copolymer.

Alternatively, the diamine and the dicarboxylic dihalide for forming the amide structural unit are reacted to prepare an amide oligomer having an amino group at both ends, and a dianhydride is added to the resultant as a diamine monomer, to prepare a poly(amic acid-amide) copolymer. The latter method may not need a precipitation process for removing HCl generated from a process of forming amide, thus shortening process time and increasing a yield of a final product, the poly(amide-imide) copolymer.

The poly(amic acid-amide) copolymer may be chemically or thermally imidized, if necessary, and thus converted into a poly(amide-imide) copolymer, and the polyhedral oligomeric silsesquioxane may be added thereto, to obtain a composition for preparing an organic/inorganic hybrid poly (amide-imide) copolymer according to an embodiment.

The composition for preparing an organic/inorganic hybrid poly(amide-imide) copolymer may be coated on a Specifically, 1 mol equivalent (0.122 moles (mol), 39.2 grams (g)) of 2,2'-bis(trifluoromethyl)benzidine (TFDB) and 2.8 mol equivalent (0.343 mol, 27.11 g) of pyridine are dissolved in 700 g of N,N-dimethyl acetamide as a solvent in a round-bottomed flask. 50 milliliters (ml) of DMAC is further added to completely dissolve the remaining TFDB, and 17.4 g (0.7 mol equivalent, 0.086 mol) of TPCI (terephthaloic dichloride) is divided into four portions and mixed with the 25° C. TFDB solution. Then, the mixture is vigorously stirred for 15 minutes.

The resulting solution is stirred under a nitrogen atmosphere for 2 hours and added to 7 liter (L) of a NaCl solution containing 350 g of NaCl, and the mixture is stirred for 10 minutes. The solid produced therein is filtered, re-suspended twice in 5 L of deionized water, and re-filtered. Subsequently, the finally filtered product on a filter is appropriately pressed to remove water remaining and dried at 90° C. under vacuum for 48 hours, obtaining an amide structural unit-containing oligomer as a product described in Reaction Scheme 1. The amide structural unit-containing oligomer has a number average molecular weight of about 997.

Synthesis Example 2: Synthesis of 70 Mol % of Amide Structural Unit-Containing Poly(Amide-Imide) Copolymer 25 g (0.0182 mol) of the amide structural unit-containing oligomer according to Synthesis Example 1 is placed in a 250 ml 4-necked double-wall reactor equipped with a mechanical stirrer and a nitrogen inlet and preheated at 30° C., to which 143 ml of DMAc is added. The solution is stirred at 30° C. under a nitrogen atmosphere until the oligomer is completely dissolved. 4.44 g (0.01 mol) of 6FDA (2,2-bis-(3,4-dicarboxylphenyl)hexafluoropropane dianhydride) and 2.4 g (0.0082 mol) of BPDA (3,3',4,4'-biphenyltetracarboxylic dianhydride are slowly added to the solution where the oligomer is dissolved. 10 ml of NMP is further added thereto, the obtained solution is stirred for 48 hours, obtaining a poly(amic acid-amide) solution having a solid concentration of 16%.

The temperature of the solution is decreased to 25° C., 5.57 g of anhydrous acetic acid is added to the poly(amic acid-amide) solution, and the mixture is stirred for 30 minutes. 4.32 g of pyridine is subsequently added thereto, and the obtained mixture is further stirred for 48 hours, obtaining a poly(amide-imide) solution.

Examples 1 to 7 and Comparative Example 1: Tsp-POSS-Containing Organic/Inorganic Hybrid Poly(Amide-Imide) Copolymer Composite and Film Using the Same Film Each organic/inorganic hybrid poly(amide-imide) copolymer solution according to Examples 1 to 7 is obtained by respectively adding trisilanolphenyl silsesquioxane (tsp-POSS) represented by Chemical Formula 14 to the poly(amide-imide) copolymer solution according to Synthesis Example 2 in an amount provided in Table 1 based on 100 parts by weight of a solid content of the copolymer. Each mixture with is subsequently stirred with an overhead stirrer for about 30 minutes.

Chemical Formula 14

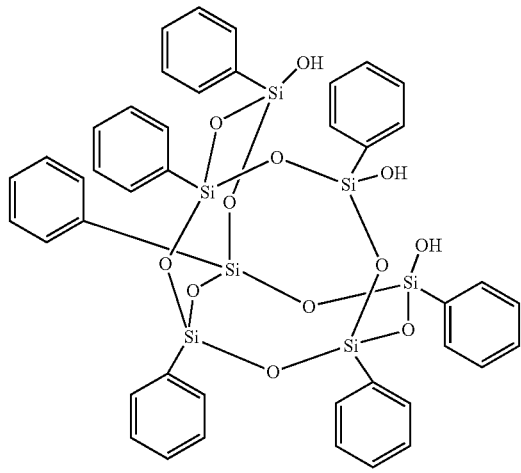

The copolymer solution is coated on a glass plate to cast a film. The coated solution is dried on a 80° C. hot plate for one hour, the solution-cast plate is placed in an oven and heated up to 300° C. at a speed of 3 degrees Centigrade per minute (° C./min) and slowly cooled down. Then, an organic/inorganic hybrid poly(amide-imide) composite film is finally separated and obtained.

In addition, a film according to Comparative Example 1 is formed according to the same method as Examples except for adding no tsp-POSS.

Subsequently, yellow index (YI), haze, tensile modulus, pencil hardness and Marten's hardness of the film are measured, and the results are provided in Table 1.

Figure 2:
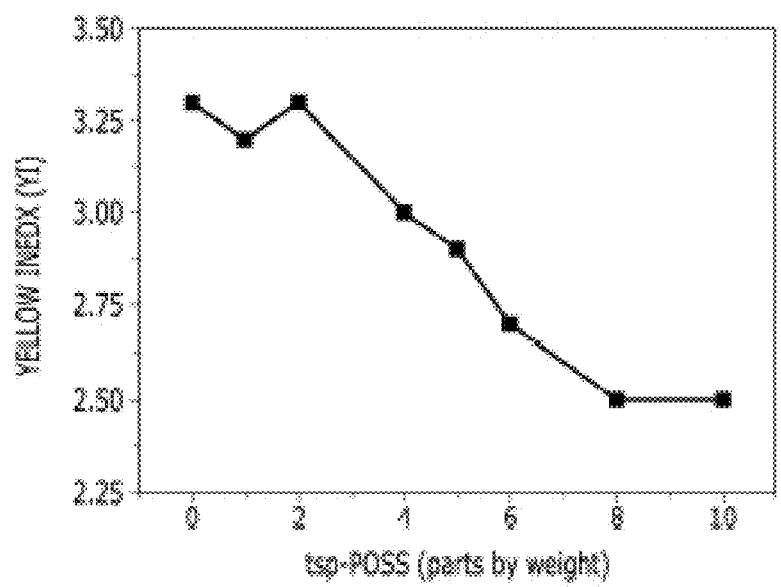
FIG. 2 is a graph of yellow index (YI) versus amount of trisilanolphenyl silsesquioxane (parts by weight, wt %), showing a yellow index change of films according to Comparative Example 1 and Examples 1 to 7 depending on an amount of trisilanolphenyl silsesquioxane (tsp-POSS) by respectively adding 0 to 10 parts by weight of the tsp-POSS based on 100 parts by weight of a solid content of the poly(amide-imide) copolymer to form the films.
Figure 3:
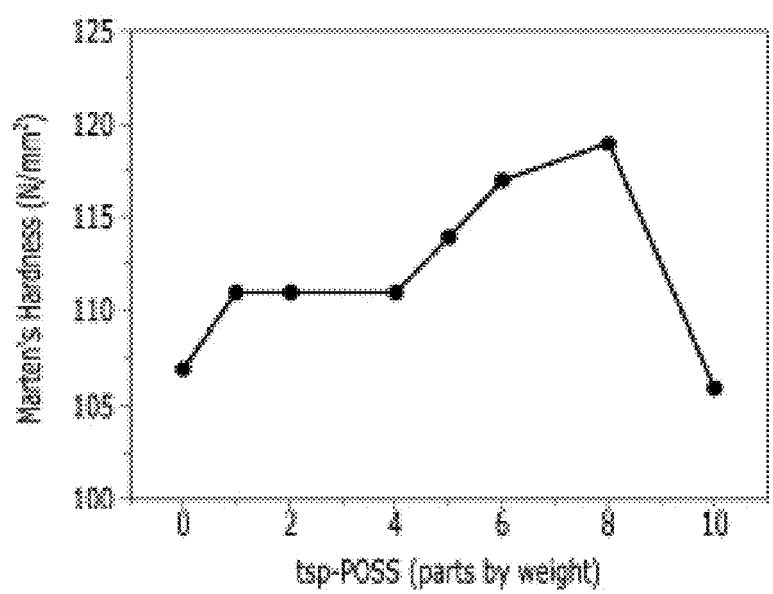
FIG. 3 is a graph of hardness change (Newtons per square millimeter, $N/mm^2$) versus amount of trisilanolphenyl silsesquioxane (parts by weight, wt %), showing a Marten's hardness change of the films of Comparative Example 1 and Examples 1 to 7 depending on the amounts of the trisilanolphenyl silsesquioxane (tsp-POSS) by respectively adding 0 to 10 parts by weight of the tsp-POSS to 100 parts by weight of a solid content of the poly(amide-imide) copolymer to form the films.

In addition, YI change and Marten's hardness change depending on the amount of tsp-POSS are respectively provided in FIGS. 2 and 3.

Herein, the yellow index (YI) is measured with a reference to an 80 micrometer (μm)-thick film by using a spectrum colorimeter, CM-3600d made by Konica Minolta Inc. and obtained by an ASTM E313 method. The tensile modulus is measured by using an ASTM D882 method. The pencil hardness is measured in an ASTM D3363 method, and the Marten's hardness is measured by using Fisher-scope® HM2000 L T Helmut made by Fisher Technology Inc.

TABLE 1

| | tsp-POSS (parts by weight) | YI @ 80 μm (ASTM E313) | Haze | Tensile Modulus (GPa) | Pencil Hardness | HM (N/mm²) |
|---|---|---|---|---|---|---|
| Comparative Example 1 | 0 | 3.3 | 0.9 | 4.7 | F | 107.2 |
| Example 1 | 1 | 3.2 | 0.8 | 5.2 | F | 110.9 |
| Example 2 | 2 | 3.3 | 1.0 | 5.1 | F | 109.5 |
| Example 3 | 4 | 3.0 | 0.8 | 4.9 | H | 111.1 |
| Example 4 | 5 | 2.9 | 1.0 | 5.0 | 2H | 114.3 |
| Example 5 | 6 | 2.7 | 1.1 | 5.1 | H | 116.6 |
| Example 6 | 8 | 2.5 | 1.2 | 5.0 | 2H | 119.2 |
| Example 7 | 10 | 2.5 | 1.0 | 4.8 | H | 105.5 |

Referring to Table 1, the organic/inorganic hybrid composite films including trisilanolphenyl silsesquioxane within all amount ranges has at least the same YI as, and lower YI than, the film formed by using a poly(amide-imide) copolymer including no trisilanolphenyl silsesquioxane (tsp-POSS). In addition, the haze has a little change depending on an amount of tsp-POSS but maintains almost equivalent YI. Accordingly, the organic/inorganic hybrid composite films including less than or equal to 10 parts by weight of tsp-POSS based on 100 parts by weight of a solid content of the polymer show much improved optical characteristics.

In addition, the organic/inorganic hybrid composite film including trisilanolphenyl silsesquioxane shows higher or equivalent mechanical properties, that is, tensile modulus, pencil hardness, and Marten's hardness compared with the films including a poly(amide-imide) copolymer that does not include trisilanolphenyl silsesquioxane (tsp-POSS) in the above amounts.

In addition, FIG. 4 is a photograph showing the film of Example 4, and herein, the organic/inorganic hybrid composite film including 5 parts by weight of tsp-POSS is colorless and transparent.

Example 8: Tetrasilanolphenyl POSS-Containing Organic/Inorganic Hybrid Poly(Amide-Imide) Copolymer Composite and Film Using the Same An organic/inorganic hybrid poly(amide-imide) composite film is manufactured according to the same method as Examples 1 to 7 by adding 5 parts by weight of tetraphenyl silsesquioxane represented by Chemical Formula 15 based on 100 parts by weight of a solid content of the copolymer to the poly(amide-imide) copolymer solution according to Synthesis Example 2.

Chemical Formula 15

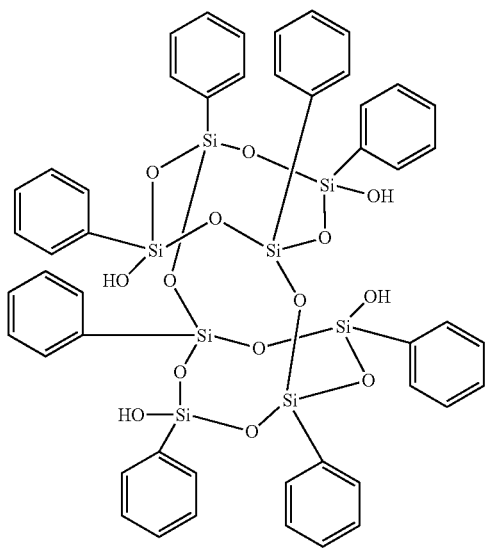

The yellow index (YI), haze, tensile modulus, and pencil hardness of the film are measured in the same method as Examples 1 to 7, and the results are provided in Table 2.

In addition, FIG. 5 provides a photograph showing the film. Referring to FIG. 5, the film of Example 8 is colorless and transparent.

Comparative Examples 2 and 3: Octaphenyl POSS and Acrylo POSS-Containing Organic/Inorganic Hybrid Poly(Amide-Imide) Copolymer Composite and Film Using the Same An organic/inorganic hybrid poly(amide-imide) composite film is manufactured according to the same method as Examples 1 to 7 by respectively adding 5 parts by weight of octaphenyl silsesquioxane (Comparative Example 2) and 5 parts by weight of acrylo silsesquioxane (Comparative Example 3) based on 100 parts by weight of a solid content of the copolymer to the poly(amide-imide) copolymer solution according to Synthesis Example 2.

For reference, the octaphenyl silsesquioxane has a structure shown in Chemical Formula 16, and the acrylo silsesquioxane has a structure shown in Chemical Formula 17:

Chemical Formula 16

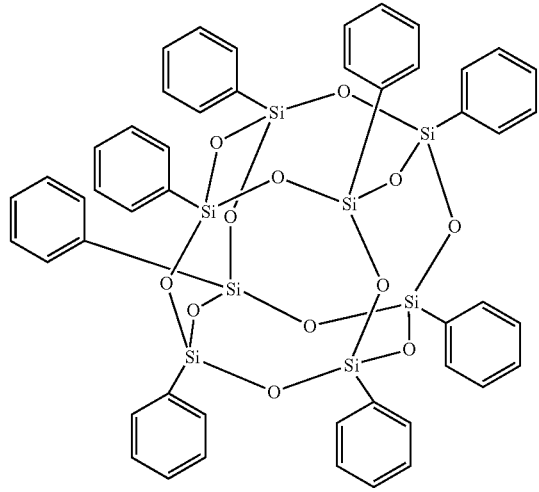

Chemical Formula 17

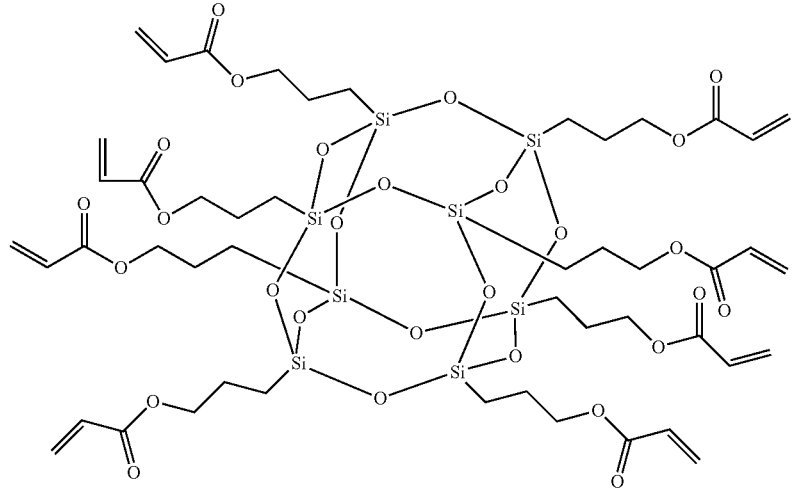

As shown in Chemical Formulae 16 and 17, neither the octaphenyl silsesquioxane nor the acrylo silsesquioxane includes a functional group capable of forming hydrogen bond.

Subsequently, yellow index (YI), haze, tensile modulus, and pencil hardness of the film are measured in the same method as Examples 1 to 7, and the results are provided in Table 2.

TABLE 2

|  | YI @ 80 μm (ASTM E313) | Haze | Tensile Modulus (GPa) | Pencil Hardness |
|---|---|---|---|---|
| Example 8 | 2.4 | 0.9 | 4.4 | 2H |
| Comparative Example 2 | 4.4 | 54 | — | — |
| Comparative Example 3 | 4.8 | 1.6 | 5.4 | F |

Referring to Table 2, the film formed of tetrasilanolphenyl POSS-containing organic/inorganic composite, which includes a polyhedral oligomeric silsesquioxane having a functional group capable of hydrogen bonding, according to Example 8 shows low YI and low haze, and thus displays excellent optical characteristics compared with the composite films according to Comparative Examples 2 and 3.

The composite film of Example 8 shows a little lower tensile modulus than the film of Comparative Example 3, but much higher pencil hardness than the composite film of Comparative Example 3.

The films according to Comparative Examples 2 and 3 are respectively shown in FIGS. 6 and 7. As shown in FIGS. 6 and 7, the composite films including a polyhedral oligomeric silsesquioxane that does not have a functional group capable of forming a hydrogen bond according to Comparative Examples 2 and 3 are yellow and not transparent.

In conclusion, a film formed of an organic/inorganic hybrid poly(amide-imide) copolymer including a polyhedral oligomeric silsesquioxane into which a functional group capable of hydrogen bonding is introduced according to an embodiment shows improved optical and mechanical characteristics. In contrast, a film formed of an organic/inorganic hybrid poly(amide-imide) copolymer including a polyhedral oligomeric silsesquioxane that does not have a functional group capable of forming a hydrogen bond shows deteriorated optical and mechanical characteristics.

Accordingly, organic/inorganic hybrid poly(amide-imide) copolymer including a polyhedral oligomeric silsesquioxane into which a functional group capable of hydrogen bonding with a poly(amide-imide) copolymer according to an embodiment is introduced and an article manufactured therefrom may be usefully applied to a window film and the like for a flexible display device requiring high transparency and surface hardness.

While this disclosure has been described in connection with what is presently considered to be practical exemplary embodiments, it is to be understood that the present inventive concept is not limited to the disclosed embodiments, but, on the contrary, is intended to cover various modifications and equivalent arrangements included within the spirit and scope of the appended claims.

What is claimed is:

1. A composition for preparing an organic/inorganic hybrid poly(amide-imide) copolymer, the composition comprising:

a poly(amide-imide) copolymer, a poly(amide-amic acid) copolymer, or a poly(amide-imide/amic acid) copolymer comprising:

a structural unit represented by Chemical Formula 1; and a structural unit represented by Chemical Formula 2, a structural unit represented by Chemical Formula 3, or a combination thereof, and a polyhedral oligomeric silsesquioxane comprising a functional group capable of forming a hydrogen bond:

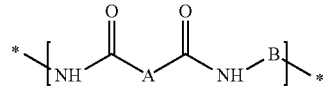

Chemical Formula 1 wherein in Chemical Formula 1,

A and B are independently a substituted or unsubstituted divalent C6 to C24 aliphatic cyclic group, a substituted or unsubstituted C6 to C24 aromatic ring group or a substituted or unsubstituted divalent C4 to C24 hetero aromatic ring group, wherein the C6 to C24 aliphatic cyclic group, the C6 to C24 aromatic ring group, or the C4 to C24 hetero aromatic ring group is present as a single ring, two or more rings thereof are fused to each other to provide a condensed ring system, or two or more of the single ring or the condensed ring system are linked through a single bond, a fluorenylene group, —O—, —S—, —C(=O)—, —CH(OH)—, —S(=O)$_2$—, —Si(CH$_3$)$_2$—, —(CH$_2$)$_p$— (wherein 1≤p≤10), —(CF$_2$)$_q$— (wherein 1≤q≤10), —CR"R'"— (wherein R" and R'" are independently hydrogen, a C1 to C10 aliphatic hydrocarbon group, a C6 to C20 aromatic hydrocarbon group, or a C6 to C20 alicyclic hydrocarbon group), —C(CF$_3$)$_2$—, —C(CF$_3$)(C$_6$H$_5$)—, or —C(=O)NH—,

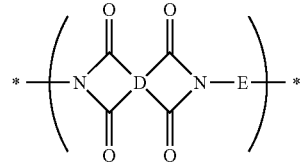

Chemical Formula 2

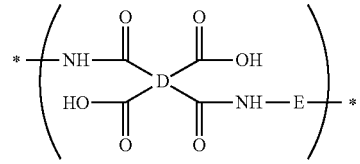

Chemical Formula 3 wherein in Chemical Formulae 2 and 3,

D is a substituted or unsubstituted tetravalent C6 to C24 aliphatic cyclic group, a substituted or unsubstituted C6 to C24 aromatic ring group, or a substituted or unsubstituted tetravalent C4 to C24 hetero aromatic ring group, wherein the C6 to C24 aliphatic cyclic group, the C6 to C24 aromatic ring group, or the C4 to C24 hetero aromatic ring group is present as a single ring, two or more rings thereof are fused to each other to provide a condensed ring system, or two or more of the single ring or the condensed ring system are linked through a single bond, —O—, —S—, —C(=O)—, —CH(OH)—, —S(=O)$_2$—, —Si(CH$_3$)$_2$—, —(CH$_2$)$_p$— (wherein 1≤p≤10), —(CF$_2$)$_q$— (wherein 1≤q≤10), —CR"R'"— (wherein R" and R'" are independently hydrogen, a C1 to C10 aliphatic hydrocarbon group, a C6 to C20 aromatic hydrocarbon group, or a C6 to C20 alicyclic hydrocarbon group), —C(CF$_3$) (C$_6$H$_5$)—, or —C(=O)NH—, and E is a substituted or unsubstituted divalent C6 to C24 aliphatic cyclic group, a substituted or unsubstituted C6 to C24 aromatic ring group or a substituted or unsubstituted divalent C4 to C24 hetero aromatic ring group, wherein the C6 to C24 the aliphatic cyclic group, the C6 to C24 aromatic ring group, or the C4 to C24 hetero aromatic ring group is present as a single ring, two or more rings thereof are fused to each other to provide a condensed ring system, or two or more of the single ring or the condensed ring system are linked through a single bond, a fluorenylene group, —O—, —S—, —C(=O)—, —CH(OH)—, —S(=O)$_2$—, —Si(CH$_3$)$_2$—, —(CH$_2$)$_p$— (wherein 1≤p≤10), —(CF$_2$)$_q$— (wherein 1≤q≤10), —CR"R'"— (wherein R" and R'" are independently hydrogen, a C1 to C10 aliphatic hydrocarbon group, a C6 to C20 aromatic hydrocarbon group, or a C6 to C20 alicyclic hydrocarbon group), —C(CF$_3$)$_2$—, —C(CF$_3$)(C$_6$H$_5$)—, or —C(=O)NH—.

2. The composition for preparing an organic/inorganic hybrid poly(amide-imide) copolymer of claim 1, wherein the functional group capable of forming a hydrogen bond of the polyhedral oligomeric silsesquioxane is —OH, —SH, —NH$_2$, or a combination thereof.

3. The composition for preparing an organic/inorganic hybrid poly(amide-imide) copolymer of claim 1, wherein the polyhedral oligomeric silsesquioxane including the functional group capable of forming a hydrogen bond is represented by Chemical Formula 4 or Chemical Formula 5:

Chemical Formula 4

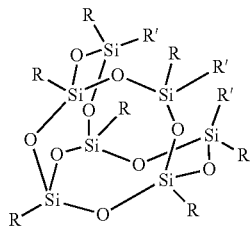

Chemical Formula 5

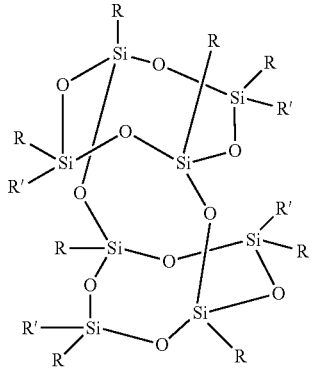

wherein in Chemical Formulae 4 and 5,
R is independently a substituted or unsubstituted C1 to C30 alkyl group, a substituted or unsubstituted C3 to C30 cycloalkyl group, a substituted or unsubstituted C6 to C30 aryl group, or a combination thereof, and
R' is independently —OH, —SH, or —NH$_2$.

4. The composition for preparing an organic/inorganic hybrid poly(amide-imide) copolymer of claim 3, wherein R of Chemical Formula 4 and 5 is independently a substituted or unsubstituted C1 to C12 alkyl group, a substituted or unsubstituted C3 to C10 cycloalkyl group, a substituted or unsubstituted C6 to C12 aryl group, or a combination thereof, and R' are each independently —OH, —SH, or —NH$_2$.

5. The composition for preparing an organic/inorganic hybrid poly(amide-imide) copolymer of claim 3, wherein R of Chemical Formula 4 and 5 is independently a cyclohexyl group or phenyl group, and each R' is —OH.

6. The composition for preparing an organic/inorganic hybrid poly(amide-imide) copolymer of claim 1, wherein A of Chemical Formula 1 is selected from chemical formulae of Group 1:

Group 1

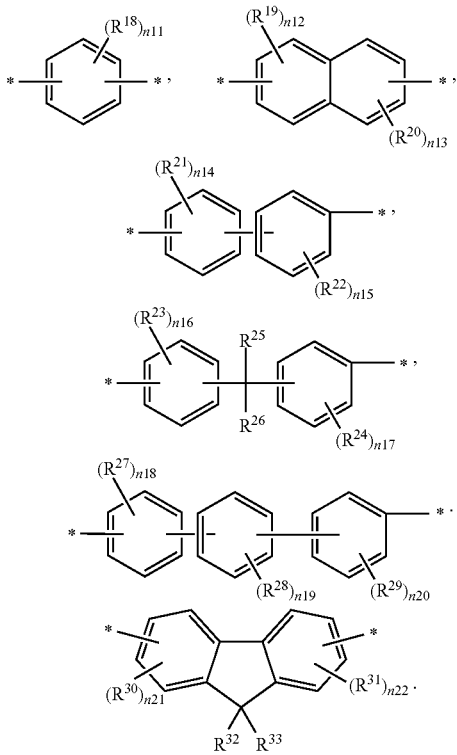

wherein in the above chemical formulae,

R$^{18}$ to R$^{33}$ are the same or different and are independently a deuterium, a halogen, a substituted or unsubstituted C1 to C10 aliphatic organic group, or a substituted or unsubstituted C6 to C20 aromatic organic group, n11 and n14 to n20 are independently an integer ranging from 0 to 4, and n12, n13, n21, and n22 are independently an integer ranging from 0 to 3.

7. The composition for preparing an organic/inorganic hybrid poly(amide-imide) copolymer of claim 1, wherein A of Chemical Formula 1 is selected from chemical formulae of Group 2:

Group 2

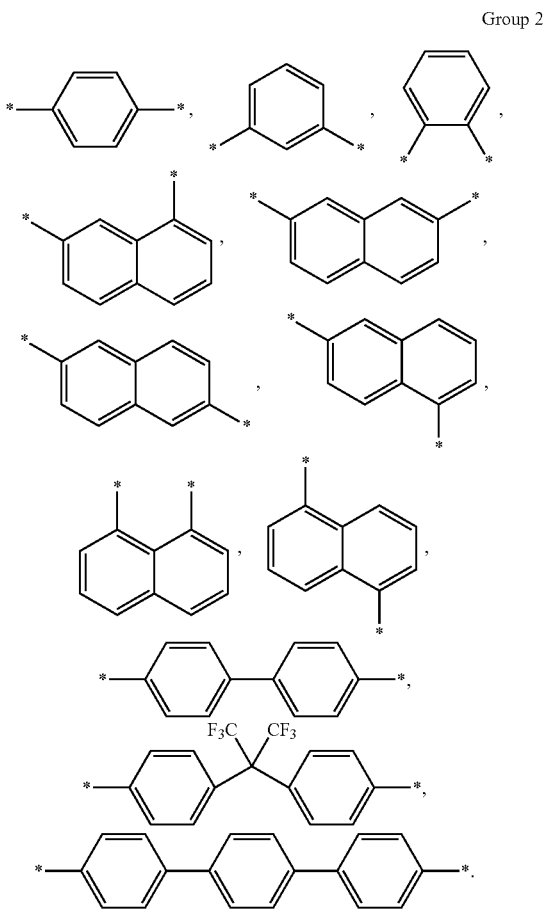

8. The composition for preparing an organic/inorganic hybrid poly(amide-imide) copolymer of claim 1, wherein B of Chemical Formula 1 is represented by Chemical Formula 6:

Chemical Formula 6

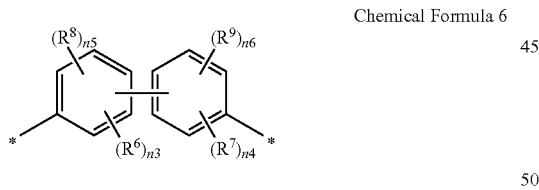

wherein in Chemical Formula 6,
$R^6$ and $R^7$ are the same or different and are independently an electron withdrawing group,
$R^8$ and $R^9$ are the same or different and are independently an alkoxy group ($-OR^{204}$, wherein $R^{204}$ is a C1 to C10 aliphatic organic group), a silyl group ($-SiR^{205}R^{206}R^{207}$, wherein $R^{205}$, $R^{206}$, and $R^{207}$ are the same as or different and are independently hydrogen, or C1 to C10 aliphatic organic group), a substituted or unsubstituted C1 to C10 aliphatic organic group, or C6 to C20 aromatic organic group,
n3 is an integer ranging from 1 to 4, n5 is an integer ranging from 0 to 3, and n3+n5 is an integer of 4 or less, and
n4 is an integer ranging from 1 to 4, n6 is an integer ranging from 0 to 3, and n4+n6 is an integer of 4 or less.

9. The composition for preparing an organic/inorganic hybrid poly(amide-imide) copolymer of claim 8, wherein $R^6$ and $R^7$ are the same or different and are independently $-CF_3$, $-CCl_3$, $-CBr_3$, $-Cl_3$, $-F$, $-Cl$, $-Br$, $-I$, $-NO_2$, $-CN$, $-COCH_3$, or $-CO_2O_2H_5$.

10. The composition for preparing an organic/inorganic hybrid poly(amide-imide) copolymer of claim 1, wherein D of Chemical Formulae 2 and 3 is independently selected from chemical formulae of Group 3:

Group 3

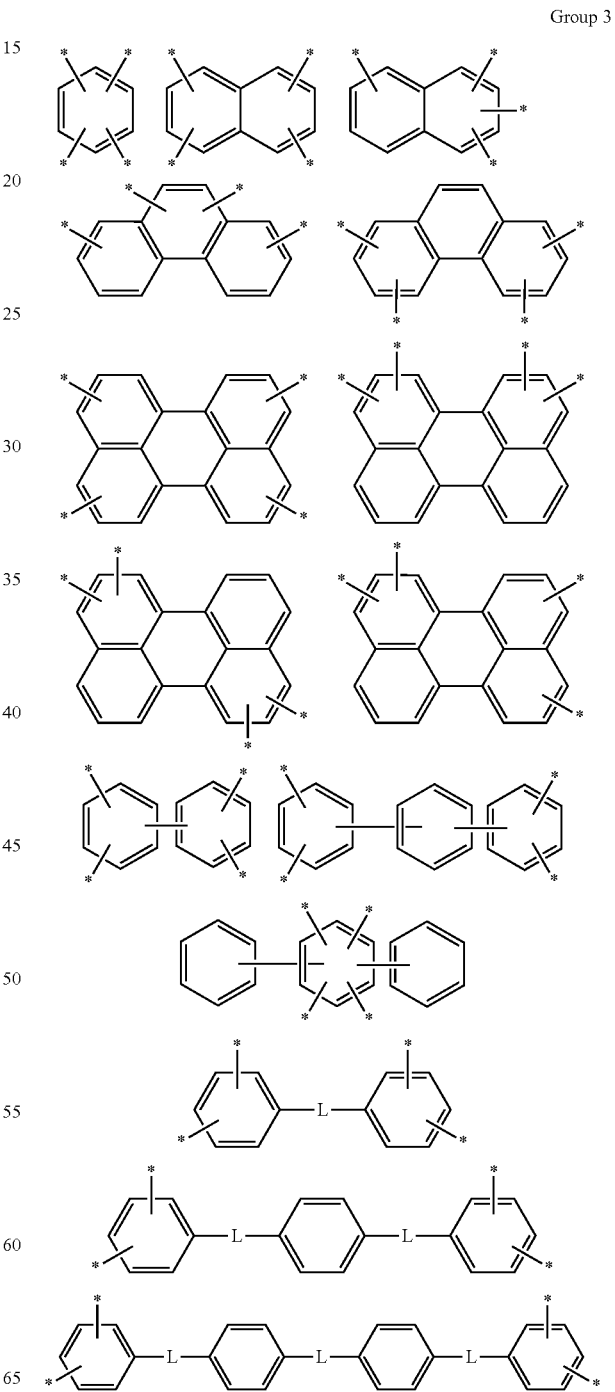

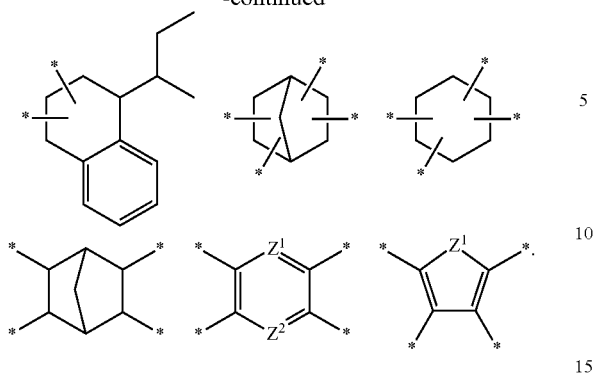

wherein in the chemical formulae,
each residual group may be substituted or unsubstituted,
each L is the same or different and are independently a direct bond, —O—, —S—, —C(=O)—, —CH(OH)—, —S(=O)$_2$—, —Si(CH$_3$)$_2$—, —(CH$_2$)$_p$— (wherein 1≤p≤10), (CF$_2$)$_q$ (wherein 1≤q≤10), —CR"R'"— (wherein R" and R'" are independently hydrogen, a C1 to C10 aliphatic hydrocarbon group, a C6 to C20 aromatic hydrocarbon group, or a C6 to C20 alicyclic hydrocarbon group), —C(CF$_3$)$_2$—, —C(CF$_3$)(C$_6$H$_5$)—, or —C(=O)NH—,

* is a linking point to an adjacent atom,

Z$^1$ and Z$^2$ are the same or different and are independently —N= or C(R$^{100}$)=, wherein R$^{100}$ is hydrogen or a C1 to C5 alkyl group, provided that Z$^1$ and Z$^2$ are not simultaneously —C(R$^{100}$)=, and Z$^3$ is —O—, —S—, or —NR$^{101}$— wherein R$^{101}$ is hydrogen or a C1 to C5 alkyl group.

11. The composition for preparing an organic/inorganic hybrid poly(amide-imide) copolymer of claim 1, wherein D of Chemical Formulae 2 and 3 is independently selected from chemical formulae of Group 4:

Group 4

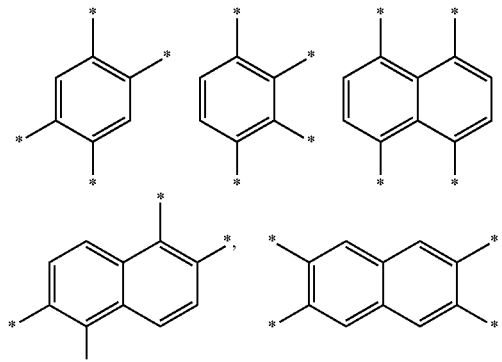

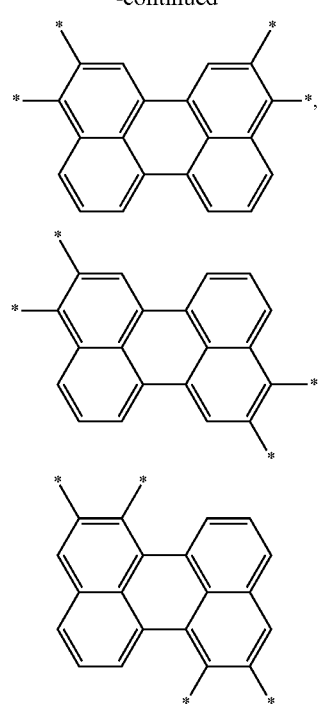

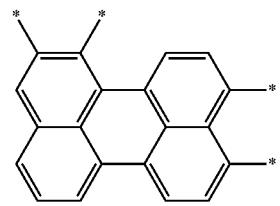

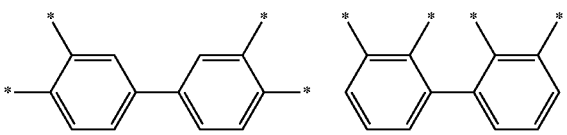

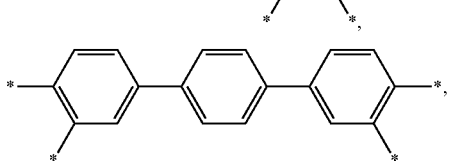

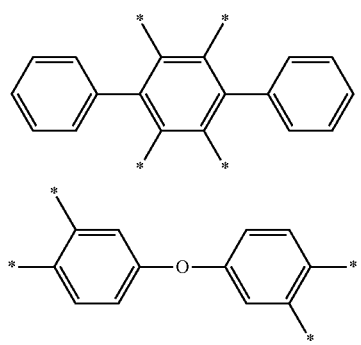

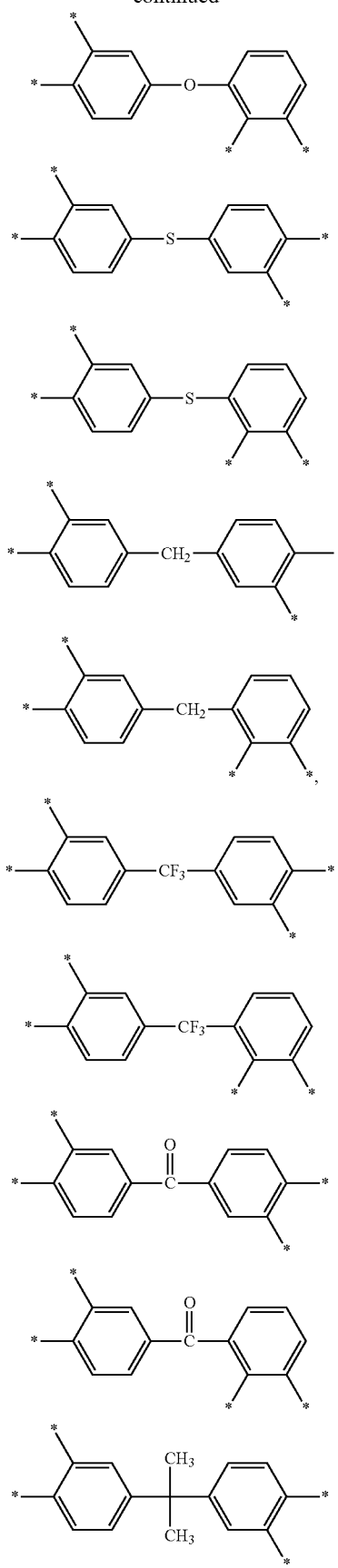
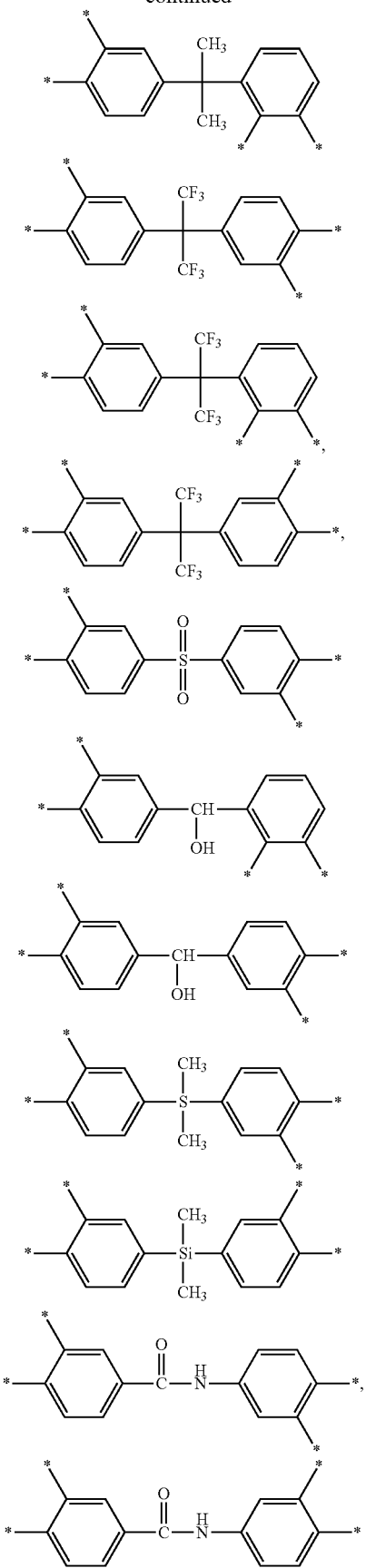

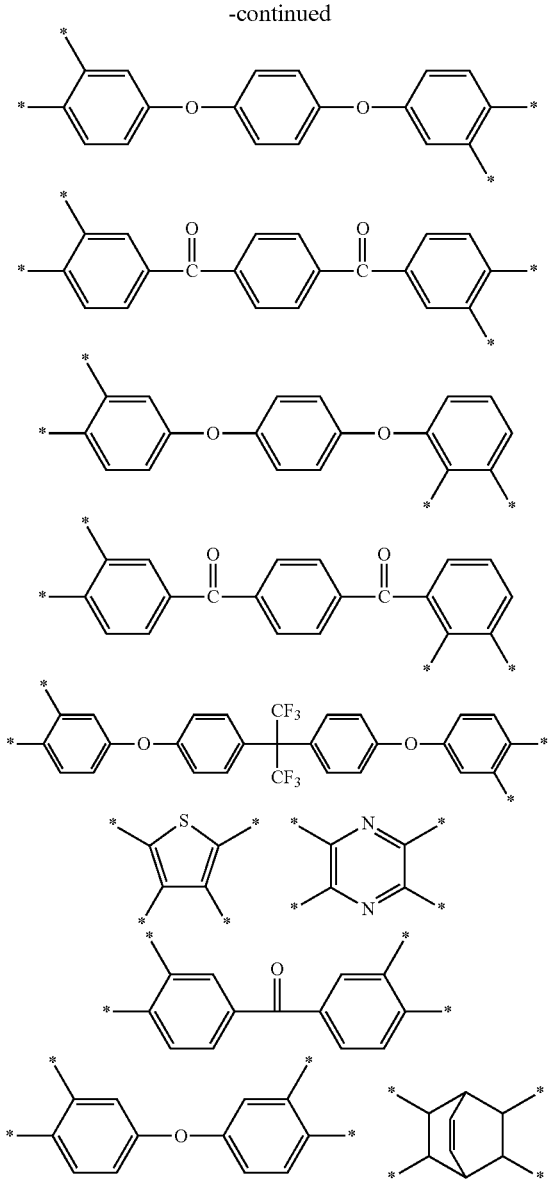

12. The composition for an organic/inorganic hybrid poly(amide-imide) copolymer of claim 1, wherein E of Chemical Formulae 2 and 3 is represented by Chemical Formula 6:

Chemical Formula 6

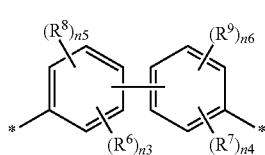

wherein in Chemical Formula 6, $R^6$ and $R^7$ are the same or different and are independently an electron withdrawing group, $R^8$ and $R^9$ are the same or different and are independently an alkoxy group (—$OR^{204}$, wherein $R^{204}$ is a C1 to C10 aliphatic organic group), a silyl group (—$SiR^{209}R^{206}R^{207}$, wherein $R^{205}$, $R^{206}$, and $R^{207}$ are the same or different and are independently hydrogen, C1 to C10 aliphatic organic group), a substituted or unsubstituted C1 to C10 aliphatic organic group, or C6 to C20 aromatic organic group, n3 is an integer ranging from 1 to 4, n5 is an integer ranging from 0 to 3, and n3+n5 is an integer of 4 or less, and n4 is an integer ranging from 1 to 4, n6 is an integer ranging from 0 to 3, and n4+n6 is an integer of 4 or less.

13. The composition for preparing an organic/inorganic hybrid poly(amide-imide) copolymer of claim 12, wherein $R^6$ and $R^7$ are the same or different and are independently —$CF_3$, —$CCl_3$, —$CBr_3$, —$Cl_3$, —F, —Cl, —Br, —I, —$NO_2$, —CN, —$COCH_3$, or —$CO_2C_2H_5$.

14. The composition for preparing an organic/inorganic hybrid poly(amide-imide) copolymer of claim 1, wherein the structural unit represented by Chemical Formula 1 comprises one or more of structural units represented by Chemical Formula 7 to Chemical Formula 9:

Chemical Formula 7

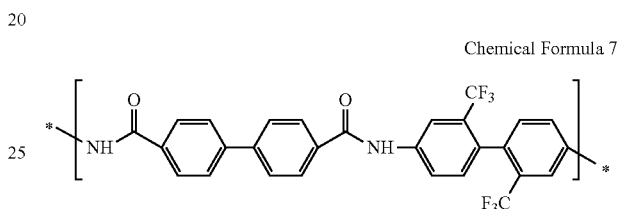

Chemical Formula 8

Chemical Formula 9

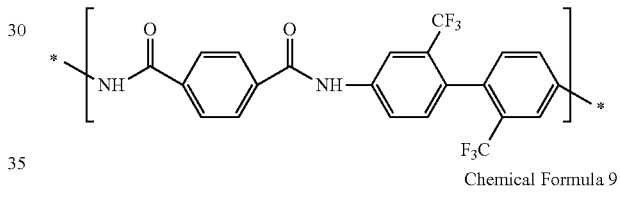

15. The composition for preparing an organic/inorganic hybrid poly(amide-imide) copolymer of claim 1, wherein the structural unit represented by Chemical Formula 2 comprises one or more of structural units represented by Chemical Formula 10 and Chemical Formula 11:

Chemical Formula 10

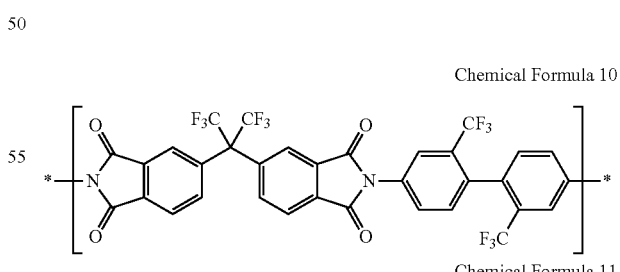

Chemical Formula 11

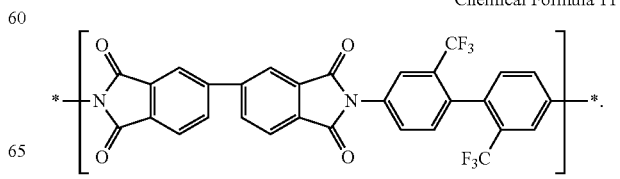

16. The composition for preparing an organic/inorganic hybrid poly(amide-imide) copolymer of claim 1, wherein the polyhedral oligomeric silsesquioxane is present in an amount of about 10 parts by weight or less based on 100 parts by weight of the solid content of the copolymer of the poly(amide-imide) copolymer, the poly(amide-amic acid) copolymer, the poly(amide-amic acid/imide) copolymer, or a combination thereof.

17. The composition for preparing an organic/inorganic hybrid poly(amide-imide) copolymer of claim 1, wherein the polyhedral oligomeric silsesquioxane is present in an amount of greater than about 3 parts by weight and less than about 10 parts by weight based on 100 parts by weight of the solid content of the copolymer of the poly(amide-imide) copolymer, poly(amide-amic acid) copolymer, the poly (amide-amic acid/imide) copolymer, or a combination thereof.

18. The composition for preparing an organic/inorganic hybrid poly(amide-imide) copolymer of claim 1, wherein the poly(amide-imide) copolymer comprises about 60 mole percent or more of the structural unit represented by Chemical Formula 1, about 40 mole percent or less of the structural unit represented by Chemical Formula 2, the structural unit represented by Chemical Formula 3, or a combination thereof, and the polyhedral oligomeric silsesquioxane is present in an amount of less than or equal to about 10 parts by weight based on 100 parts by weight of the solid content of the poly(amide-imide) copolymer.

19. An article manufactured by curing the composition for preparing poly(amide-imide) copolymer of claim 1.

20. The article of claim 19, wherein the article is a film having a yellow index (YI) of about 3.5 or less at a thickness of about 80 micrometers according to an ASTM E313 method, and a tensile modulus of greater than about 4.7 Giga Pascals according to an ASTM D882 method.

21. A display device comprising the article of claim 19.

22. A composition for preparing an organic/inorganic hybrid poly(amide-imide) copolymer, comprising:
a poly(amide-imide) copolymer comprising a structural unit represented by Chemical Formula 8, a structural unit represented by Chemical Formula 10, and a structural unit represented by Chemical Formula 11, and a polyhedral oligomeric silsesquioxane represented by Chemical Formula 12:

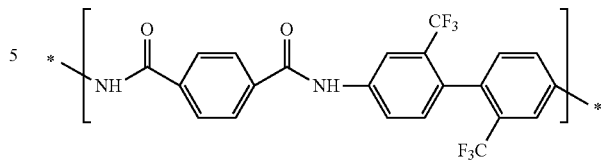

Chemical Formula 8

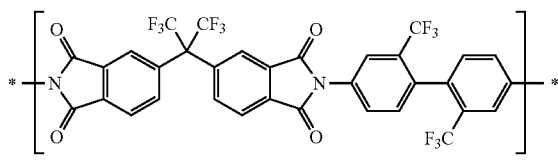

Chemical Formula 10

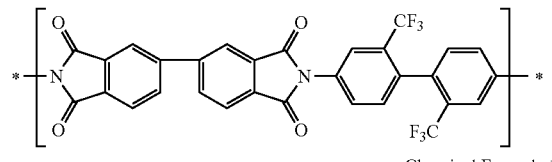

Chemical Formula 11

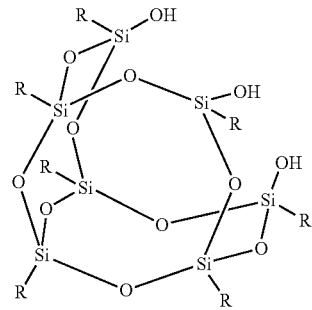

Chemical Formula 12 wherein in Chemical Formula 12, R is independently a substituted or unsubstituted C1 to C30 alkyl group, a substituted or unsubstituted C3 to C30 cycloalkyl group, a substituted or unsubstituted C6 to C30 aryl group, or a combination thereof.

* * * * *